(12) United States Patent
Savant et al.

(10) Patent No.: US 12,154,829 B2
(45) Date of Patent: Nov. 26, 2024

(54) METHOD OF MANUFACTURING SEMICONDUCTOR DEVICES AND SEMICONDUCTOR DEVICES

(71) Applicant: Taiwan Semiconductor Manufacturing Co., Ltd., Hsinchu (TW)

(72) Inventors: Chandrashekhar Prakash Savant, Hsinchu (TW); Chia-Ming Tsai, Zhubei (TW); Tien-Wei Yu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 721 days.

(21) Appl. No.: 17/070,232

(22) Filed: Oct. 14, 2020

(65) Prior Publication Data

US 2022/0115521 A1    Apr. 14, 2022

(51) Int. Cl.
   *H01L 21/8234* (2006.01)
   *H01L 29/417* (2006.01)
   *H01L 29/78* (2006.01)
   *H01L 29/66* (2006.01)

(52) U.S. Cl.
   CPC ........ *H01L 21/823431* (2013.01); *H01L 29/41791* (2013.01); *H01L 29/7851* (2013.01); *H01L 29/66803* (2013.01)

(58) Field of Classification Search
   CPC ..... H01L 21/823431; H01L 21/823821; H01L 21/28185; H01L 21/823462; H01L 21/823857; H01L 21/02142–02161; H01L 21/02172–02194; H01L 29/66795; H01L 29/785–7851; H01L 29/517; H01L 29/518; H01L 27/0886; H01L 27/1211; H01L 27/0924; H01L 29/66803; H01L 29/41791; H01L 29/167
   See application file for complete search history.

(56) References Cited

U.S. PATENT DOCUMENTS

| | | | |
|---|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |

(Continued)

*Primary Examiner* — Dale E Page
*Assistant Examiner* — Abbigale A Boyle
(74) *Attorney, Agent, or Firm* — Sterne, Kessler, Goldstein & Fox P.L.L.C.

(57) ABSTRACT

The present disclosure describes method to form a semiconductor device having a gate dielectric layer with controlled doping and to form multiple devices with different $V_t$. The method includes forming a gate dielectric layer on a fin structure, forming a buffer layer on the gate dielectric layer, and forming a dopant source layer including a dopant on the buffer layer. The gate dielectric layer includes an interfacial layer on the fin structure and a high-k dielectric layer on the interfacial layer. The method further includes doping a portion of the high-k dielectric layer adjacent to the interfacial layer with the dopant, removing the dopant source layer and the buffer layer, forming a dopant pulling layer on the gate dielectric layer, and tuning the dopant in the gate dielectric layer by the dopant pulling layer.

20 Claims, 21 Drawing Sheets

(56) References Cited

U.S. PATENT DOCUMENTS

| | | | |
|---|---|---|---|
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 2015/0035073 A1* | 2/2015 | Ando | H01L 27/092 438/783 |
| 2019/0035694 A1* | 1/2019 | More | H01L 21/823857 |
| 2020/0135475 A1* | 4/2020 | Cheng | H01L 21/823842 |

* cited by examiner

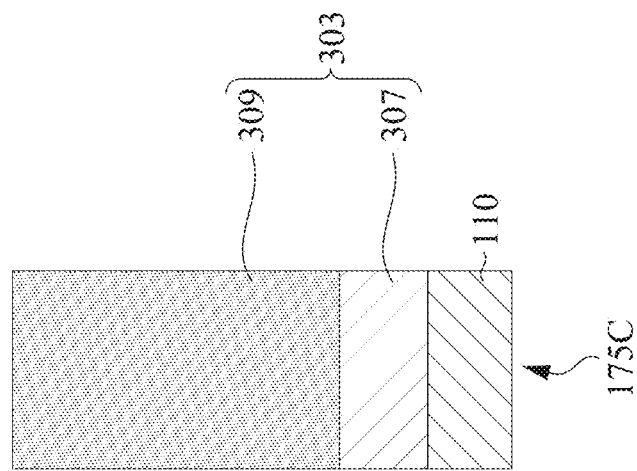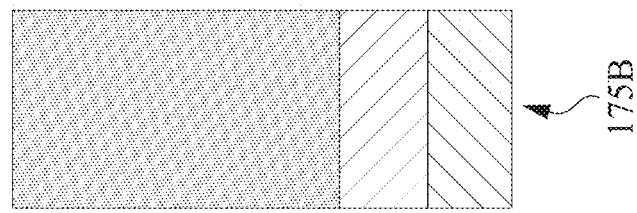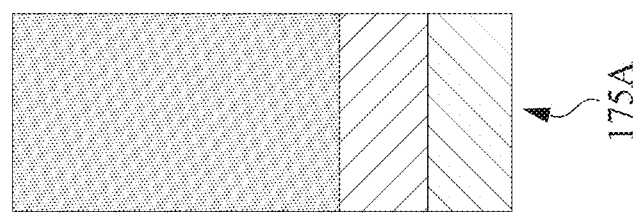
Fig. 3B

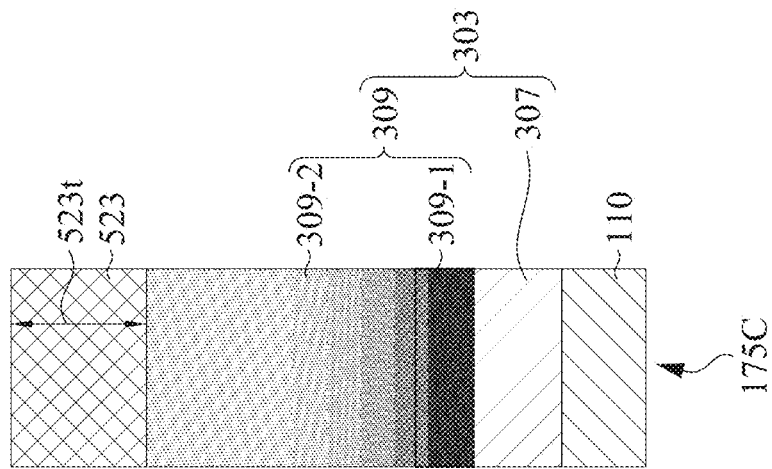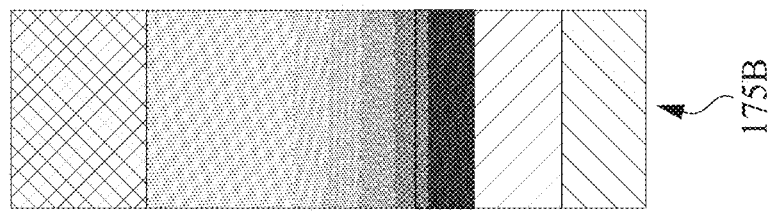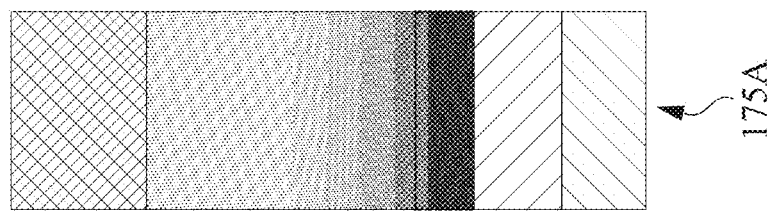
Fig. 5

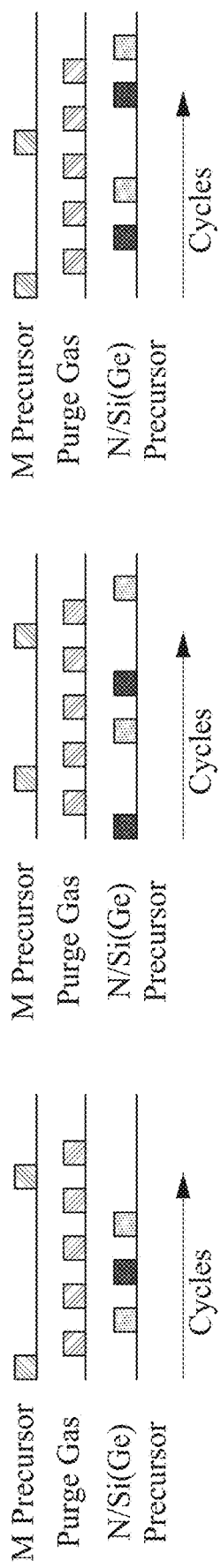
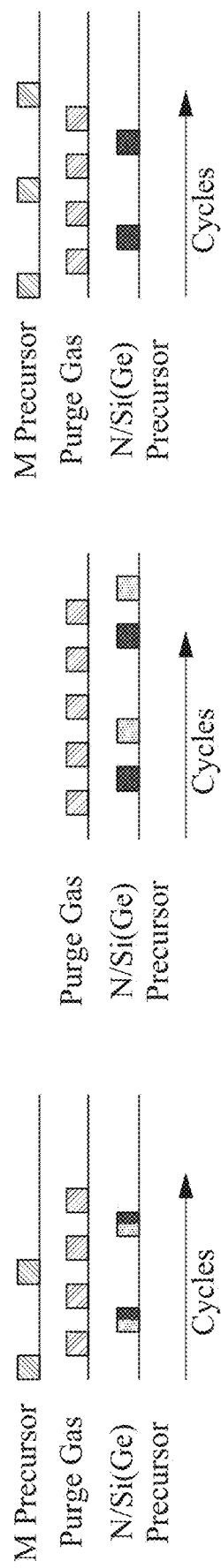
Fig. 6A  Fig. 6B  Fig. 6C
Fig. 6D  Fig. 6E  Fig. 6F

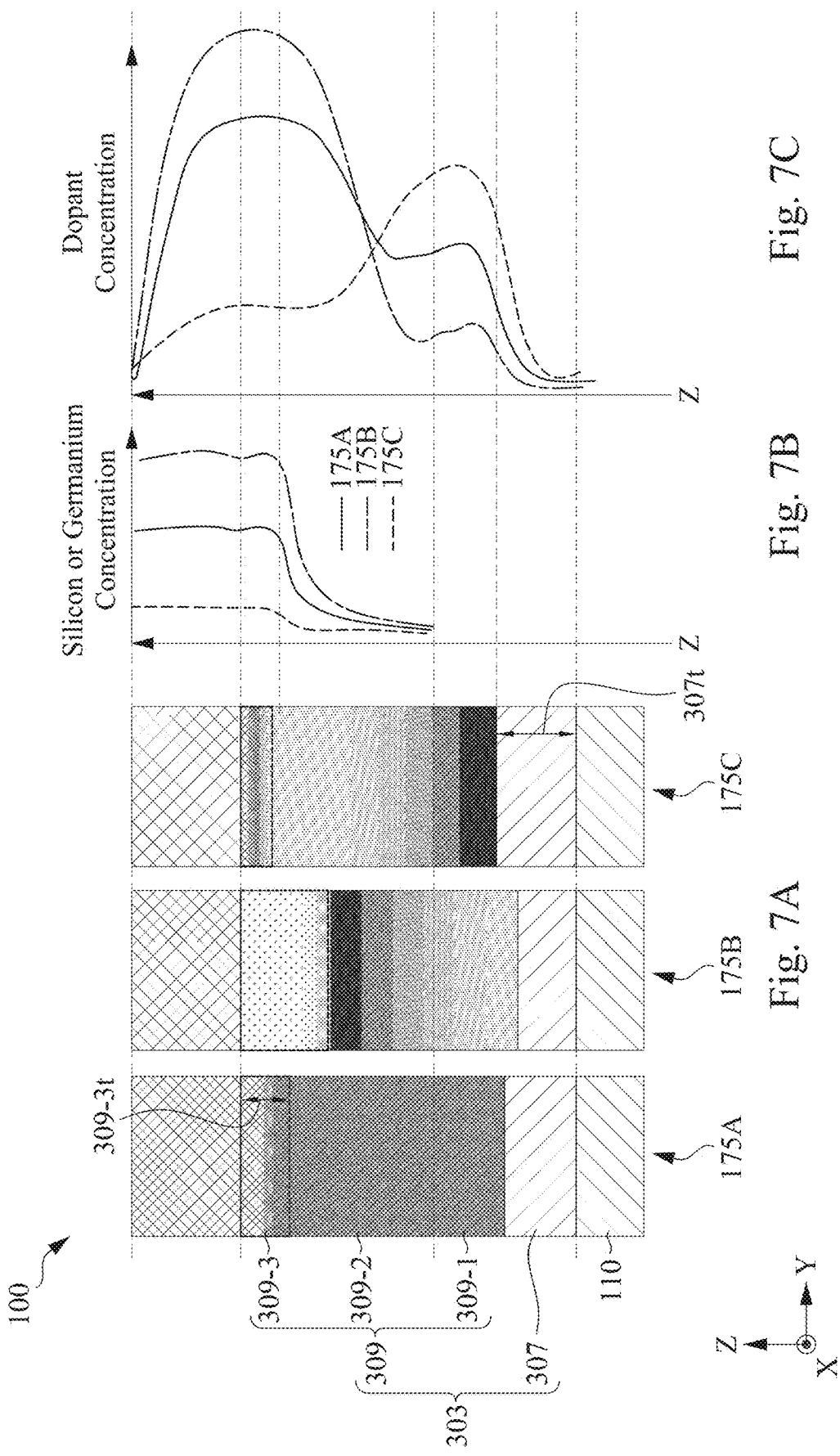

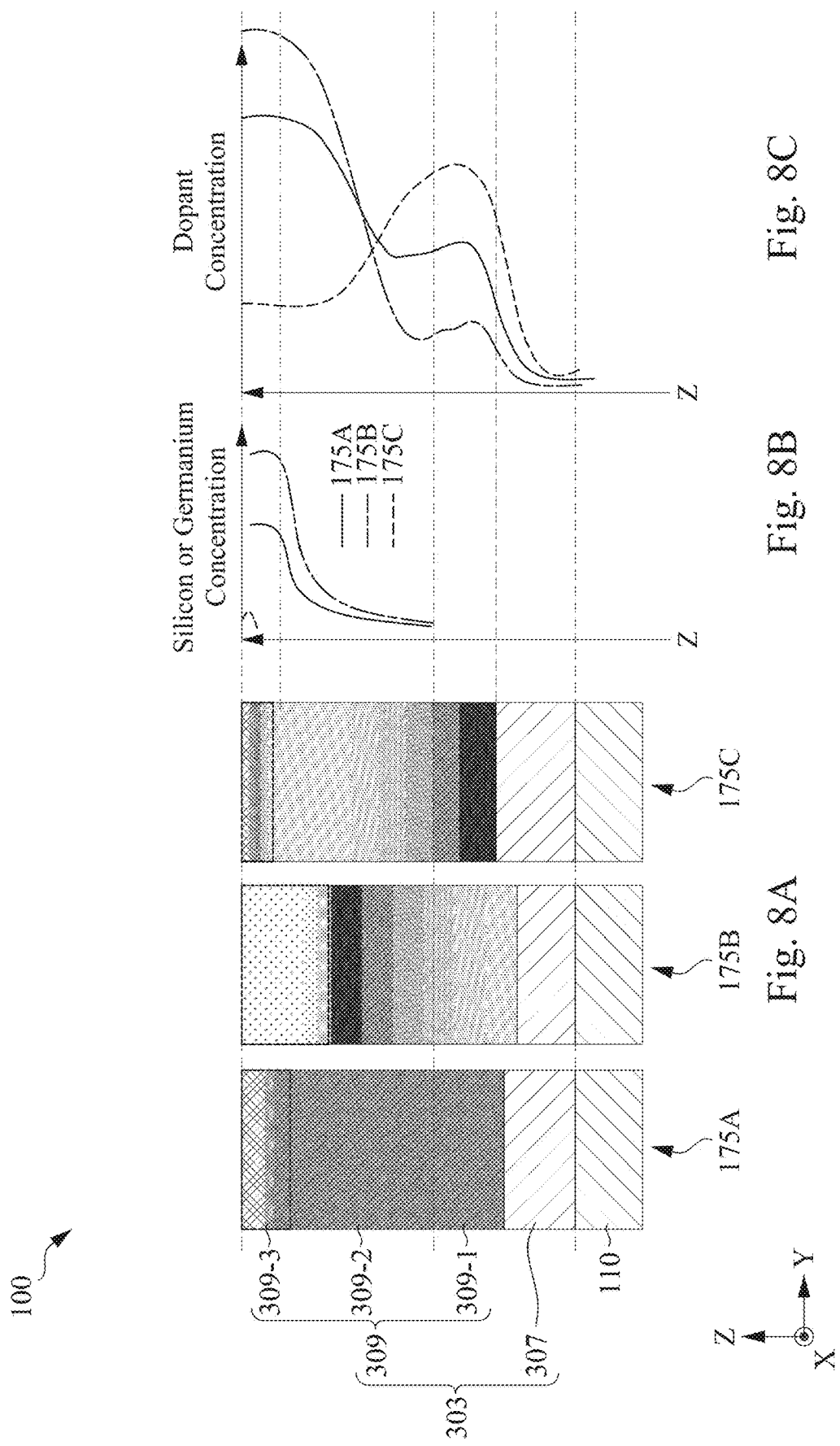

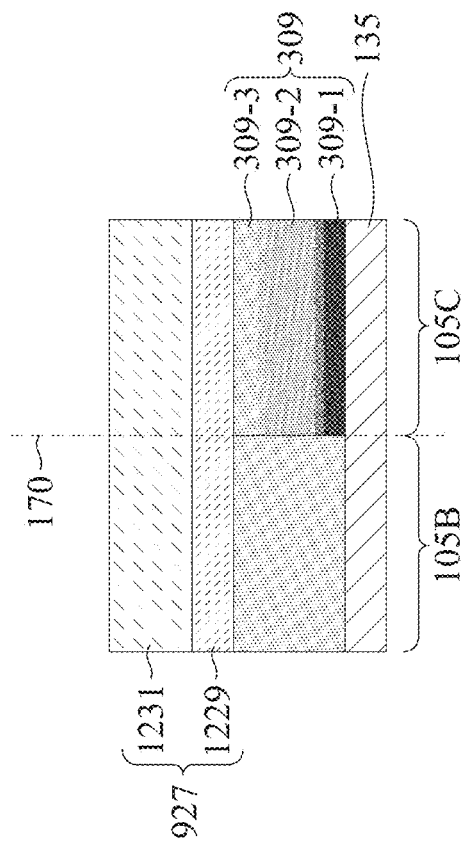
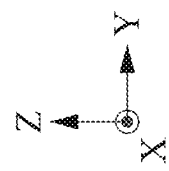
Fig. 12

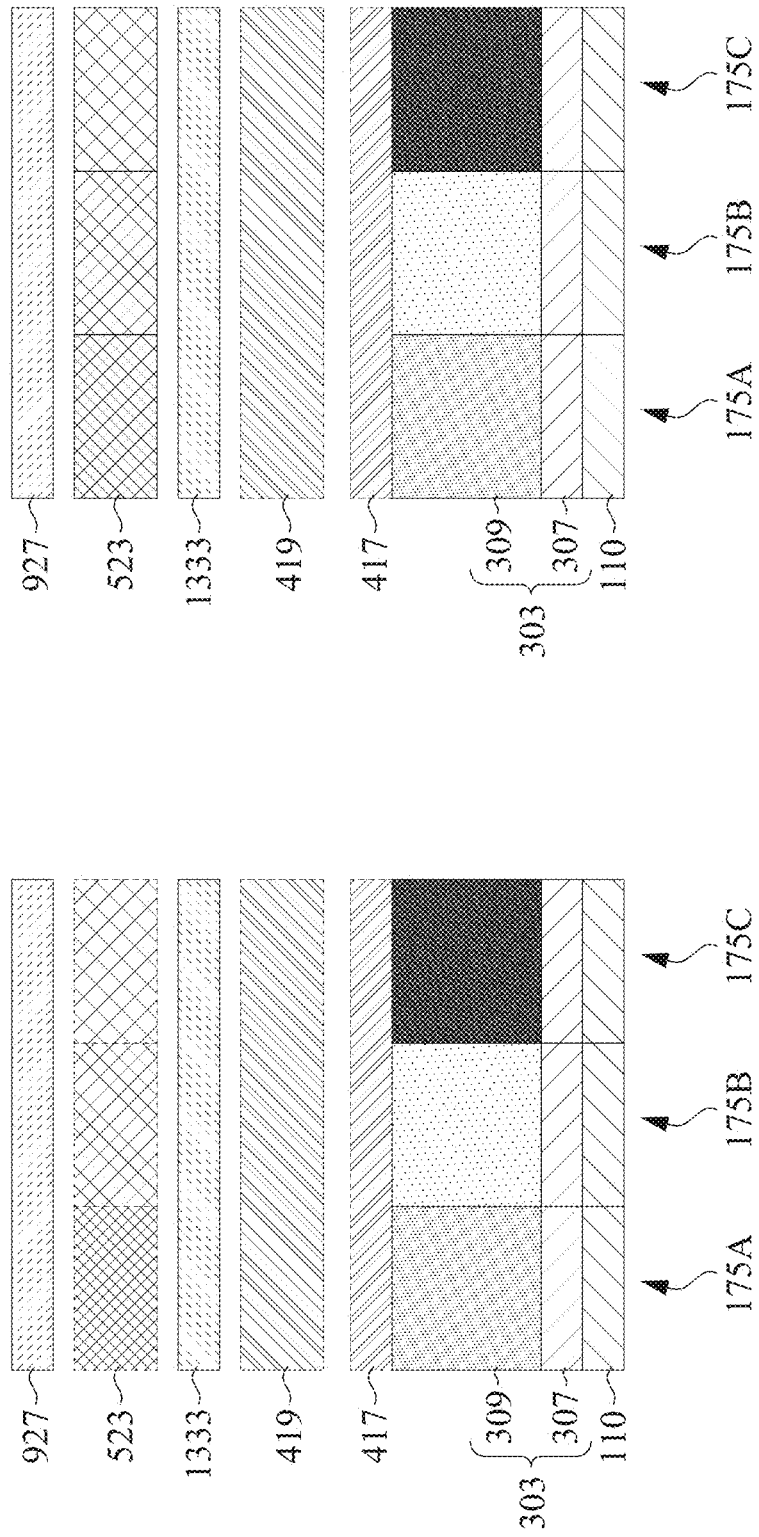

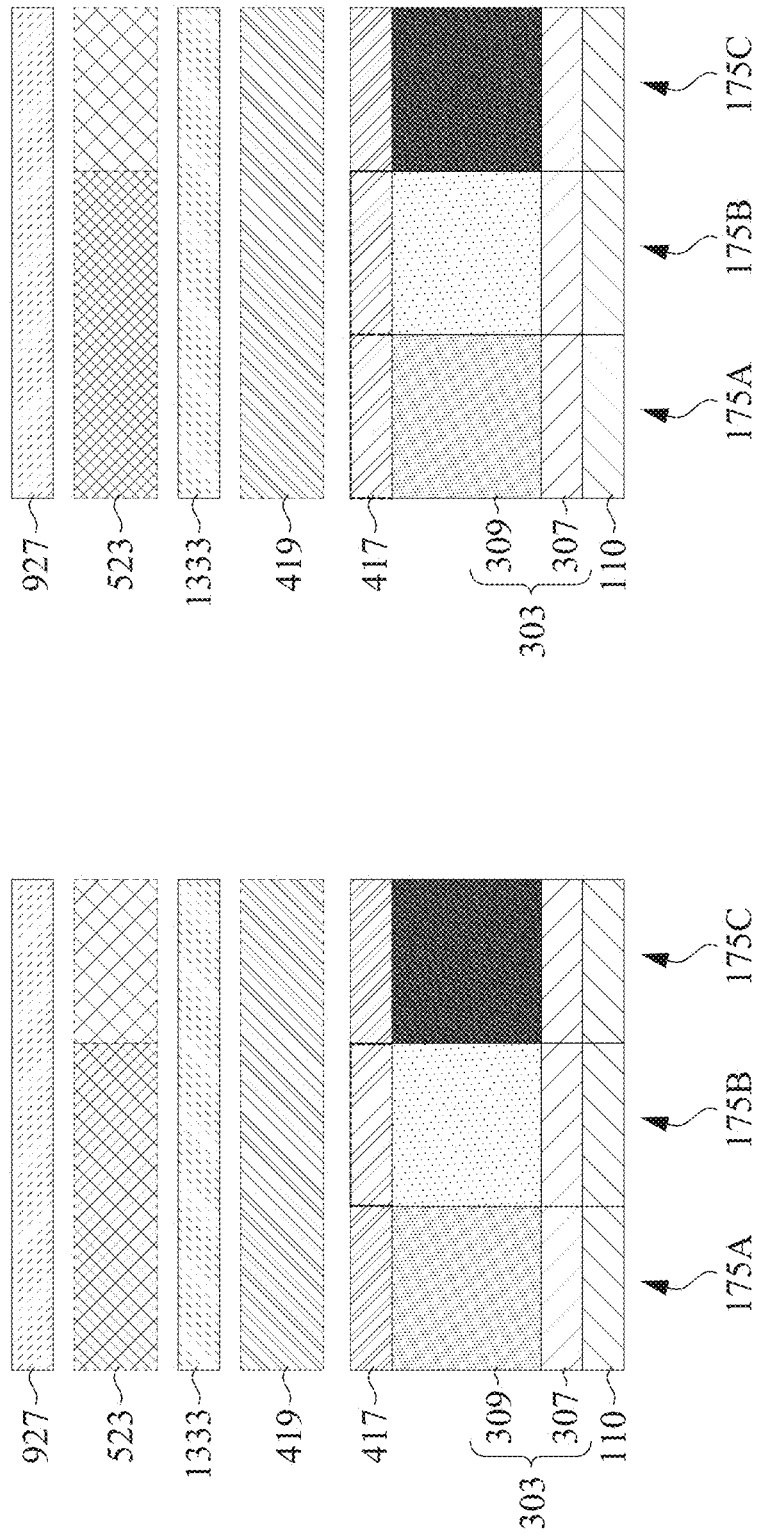

METHOD OF MANUFACTURING SEMICONDUCTOR DEVICES AND SEMICONDUCTOR DEVICES

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, fin field effect transistors (finFETs), and gate all around (GAAFETs). Such scaling down has introduced challenges to improve the performance of semiconductor devices.

BRIEF DESCRIPTION OF THE DRAWINGS

Aspects of the present disclosure are best understood from the following detailed description when read with the accompanying figures.

FIGS. 3A, 3B, 4, 5, 7A, and 8A illustrate various cross-sectional views of a semiconductor device having gate dielectric layers with controlled doping at various stages of its fabrication process, in accordance with some embodiments.

FIGS. 6A-6F illustrates various deposition sequences of forming a dopant pulling layer having different silicon or germanium concentrations on a gate dielectric layer, in accordance with some embodiments.

FIGS. 7B, 7C, 8B, and 8C illustrate distributions of the dopant and silicon in gate dielectric layers of a semiconductor device with controlled doping at various stages of its fabrication process, in accordance with some embodiments.

FIG. 12 illustrates a partial cross-sectional view at a boundary between two devices having different dielectric layers with controlled doping, in accordance with some embodiments.

FIGS. 13A-13H illustrate various embodiments of forming semiconductor devices having gate dielectric layers with controlled doping, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
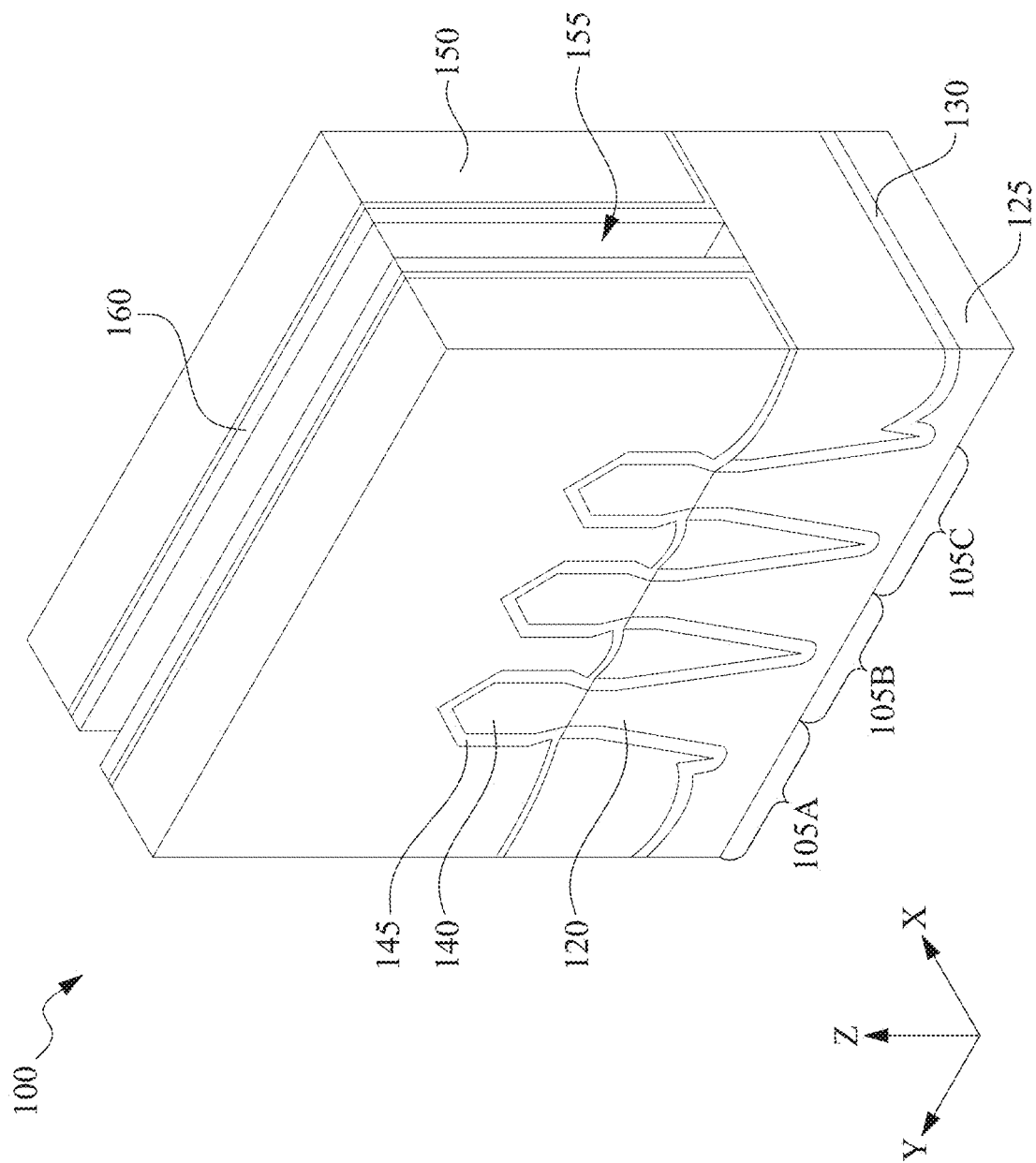
FIGS. 1A, 1B, and 1C illustrate isometric views and a cross-sectional view of a partially-fabricated semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

With increasing demand for lower power consumption, higher performance, and smaller semiconductor devices, dimensions of semiconductor devices continue to scale down. Field effect transistors (FETs) with multiple threshold voltages ($V_t$) can be manufactured for various applications. For example, FETs with a low $V_t$ (e.g., between about 50 mV and about 160 mV) can be used for "low" or "ultra-low" power applications within a chip, and FETs with high $V_t$ (e.g., greater than about 200 mV) can be used for high power applications within the chip. In addition, n-type FETs (also referred to as "NFETs") and p-type FETs (also referred to as "PFETs") can be manufactured with different $V_t$ suitable for each type of FET. The term "p-type" can be associated with a structure, layer, and/or region doped with p-type dopants, such as boron. The term "n-type" can be associated with a structure, layer, and/or region doped with n-type dopants, such as phosphorus. Dipole engineering can be used to modulate the effective work function of metal gates and form multiple threshold voltages for the semiconductor devices. Dipoles can be formed by diffusing dopants from a dopant source layer on a gate dielectric layer to an interface of a high-k dielectric layer and an interfacial layer of the gate dielectric layer. The term "high-k" can refer to a high dielectric constant. In the field of semiconductor device structures and manufacturing processes, high-k can refer to a dielectric constant that is greater than the dielectric constant of $SiO_2$ (e.g., greater than about 3.9). The interfacial layer can include silicon oxide, germanium oxide, or silicon germanium oxide. The dopant can have high chemical affinity for silicon or germanium and can form dopant dipoles with silicon or germanium at the interface under a thermal condition (e.g., a thermal anneal). The amount of dopants diffused to the interface and the amount of dopant dipoles formed at the interface can tune the $V_t$ of the FETs.

With technology scaling the number of devices requiring different $V_t$ increases, different methods and techniques are needed to form multiple $V_t$ devices. With the continuous scaling down of device dimensions and the increasing demand for device performance, dipole engineering can have its challenges. For example, the dopant source layer on the gate dielectric layer can mix with the high-k dielectric layer and form compound particle defects that may not be removed during a subsequent etching process to remove the dopant source layer. The compound particle or residue defects can lead to non-uniform $V_t$ on a channel of a FET, especially at critical areas such as channel corners (e.g., fin-spacer corners and nanosheet-spacer corners), and can degrade the device performance of the FET. In addition, the etch selectivity between the dopant source layer and the high-k dielectric layer may not be sufficient to prevent non-uniform and/or excessive loss of the high-k dielectric layer during the etching process. The term "etch selectivity" can refer to the ratio of the etch rates of two different materials under the same etching conditions. Moreover, the uniformity of the dopant source layer degrades as the thickness of the dopant source layer continues to scale down to achieve a smaller dopant dipole requirement at the interface of the high-k dielectric layer and the interfacial layer for a smaller $V_t$ shift. As a result, FETs with smaller $V_t$ shift (e.g., about 28 mV or less) may not be formed. Furthermore, the $V_t$ of adjacent FETs can shift due to a diffusion of metals, such as the dopant, from the gate dielectric layers of one FET to the adjacent FET across the boundary of adjacent FETs, which is referred to as "boundary effect" (BE). The dopants in the gate dielectric layer can diffuse across the boundary and can shift $V_t$ of adjacent FETs.

Various embodiments of the present disclosure provide methods for forming a semiconductor device having a gate dielectric layer with controlled doping and methods of forming multiple FETs with different $V_t$. In some embodiments, a gate dielectric layer of the semiconductor device can be formed on a fin structure. The gate dielectric layer can include an interfacial layer on the fin structure and a high-k dielectric layer on the interfacial layer. In some embodiments, a buffer layer can be formed on the gate dielectric layer. A dopant source layer can be formed on the buffer layer to dope a portion of the high-k dielectric layer adjacent to the interfacial layer and form dopant dipoles at the interface of the high-k dielectric layer and the interfacial layer. After removal of the buffer layer and the dopant source layer, a dopant pulling layer can be formed on the gate dielectric layer. The dopant pulling layer can include different concentrations of silicon and/or germanium to tune the dopant in the gate dielectric layer under a thermal condition, thereby tuning the $V_t$ of the semiconductor device and forming multiple FETs with different $V_t$.

The buffer layer can prevent mixing of the dopant source layer and the high-k dielectric layer, thereby reducing mixed compound particle defects. In addition, the buffer layer can have a higher etch (e.g., wet etch) selectivity to the high-k dielectric layer compared to the dopant source layer, which can reduce non-uniform and/or excessive loss of the high-k dielectric layer during the etching process. A uniform dopant profile in the gate dielectric layer across fin can be achieved with the buffer layer and the dopant pulling layer. With the dopant diffused from the dopant source layer through the buffer layer and the dopant tuning of the dopant pulling layer, a lower dopant concentration (e.g., less than about $5 \times 10^3$ atoms/cm$^2$) and a smaller dopant dipole at the interface can be achieved for a smaller $V_t$ shift (e.g., about 28 mV or less), uniformly throughout the wafer. In some embodiments, the buffer layer can be removed before depositing a gate electrode. In some embodiments, the buffer layer may not be removed and the dopant pulling layer can be formed on the buffer layer. In some embodiments, an additional high-k dielectric layer can be formed on the gate dielectric layer after removal of the dopant source layer. In some embodiments, the dopant pulling layer can be removed and a gate electrode can be formed on the gate dielectric layer. In some embodiments, the dopant pulling layer may not be removed and a gate electrode can be formed on the dopant pulling layer. In some embodiments, the dopant concentration in the doped portion of the high-k dielectric layer can depend on the concentration of silicon and/or germanium in the dopant pulling layer and/or a total thickness of the buffer layer. In some embodiments, an intermixing layer of the high-k dielectric layer and the dopant pulling layer can be formed in a top portion of the high-k dielectric layer. The intermixing layer can include silicon and/or germanium and can prevent metal (e.g., aluminum) diffusion from work function layers of the gate electrode into the high-k dielectric layer and improve the device reliability. In some embodiments, the dopants in the gate dielectric layer with controlled doping may not diffuse across boundaries of adjacent FETs, thereby mitigating the boundary effect.

Figure 1B:
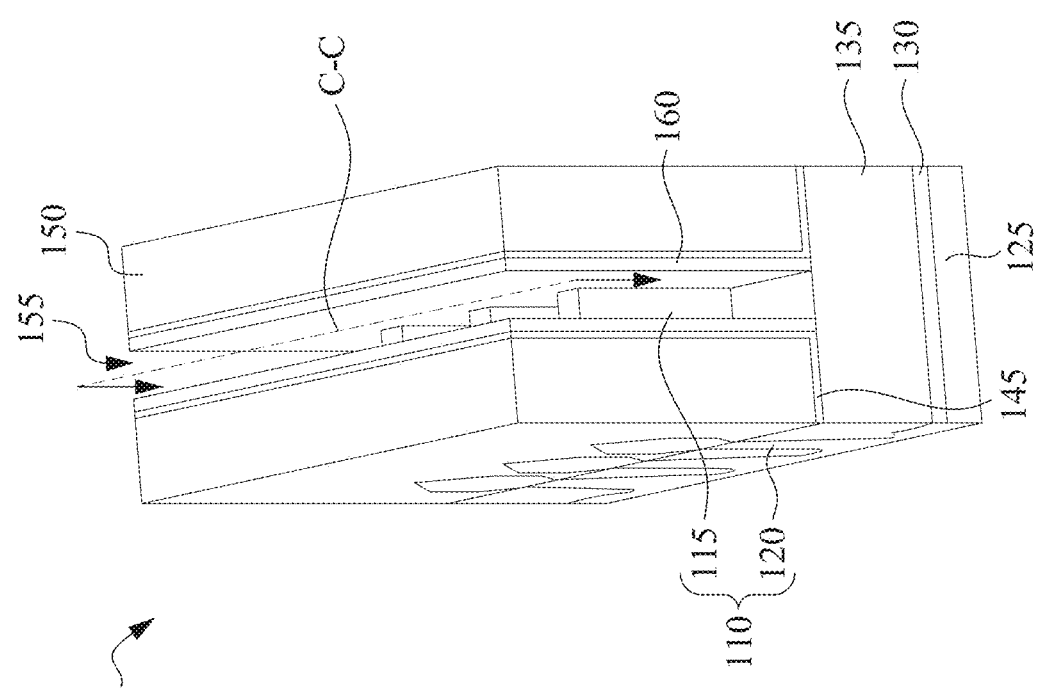
Figure 1C:
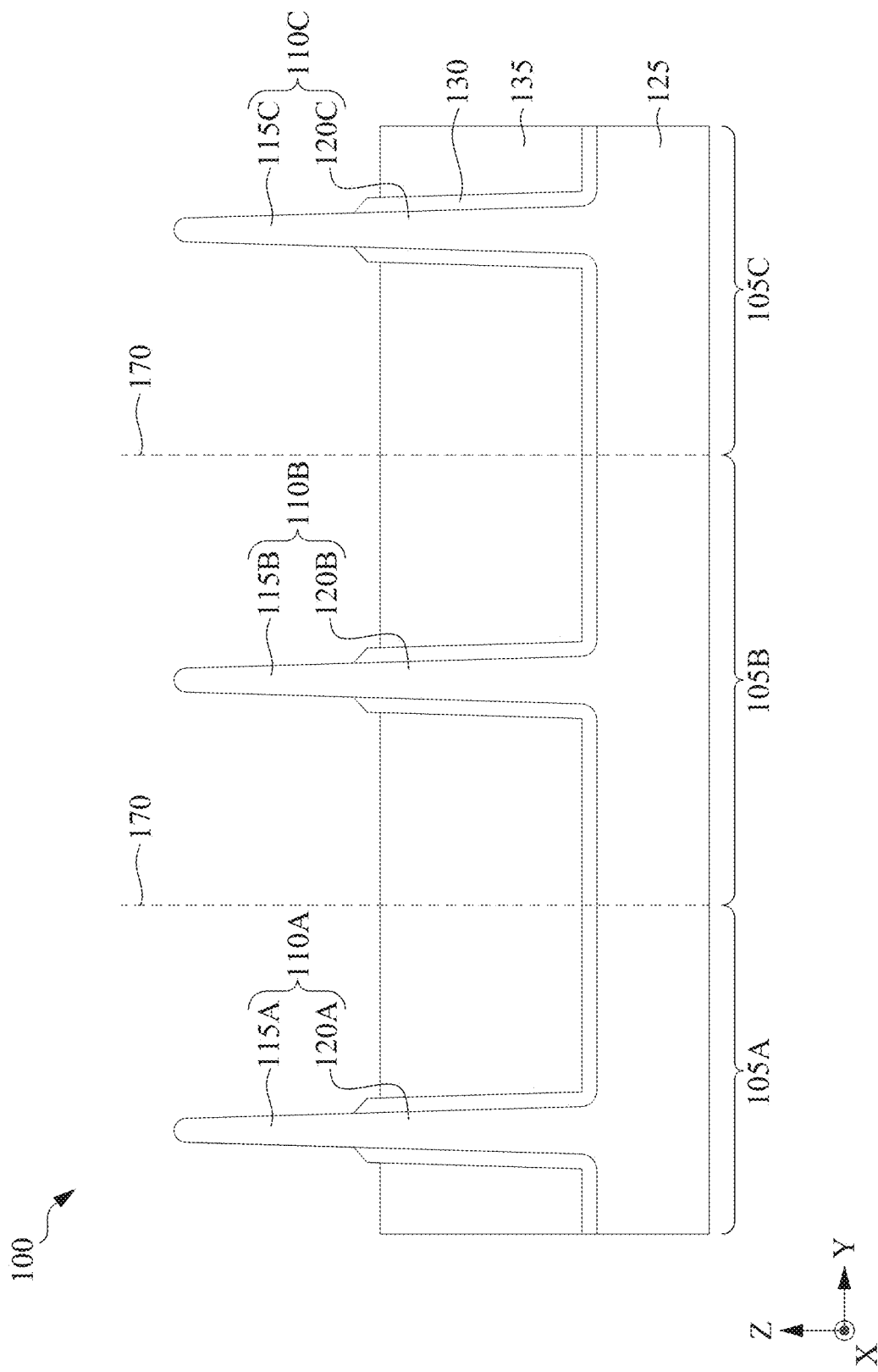

FIGS. 1A and 1B illustrate isometric views of a partially-fabricated semiconductor device 100 after the removal of a sacrificial gate stack, in accordance with some embodiments. In some embodiments, FIG. 1B shows partially-fabricated semiconductor device 100 of FIG. 1A after being rotated clock wise around the Z-axis by about 45 degrees. In other words, FIG. 1B is another view of fabricated semiconductor device 100 shown in FIG. 1A. FIG. 1C illustrates a cross-sectional view along line C-C in FIG. 1B of the partially-fabricated semiconductor device 100, according to some embodiments.

As shown in FIGS. 1A-1C, partially-fabricated semiconductor device 100 includes a FET 105A, a FET 105B, and a FET 105C formed on a substrate 125. In some embodiments, FETs 105A, 105B, and 105C can be fabricated in subsequent processes with different dopings in the gate dielectric layer to form different dopant dipoles at the interface of the high-k dielectric layer and the interfacial layer for different $V_t$. In some embodiments, FETs 105A, 105B, and 105C can be finFETs, gate-all-around FETs (GAA FETs), planar FETs, or other suitable FET devices. In some embodiments, FETs 105A, 105B, and 105C can be all p-type FETs (PFETs), all n-type FETs (NFETs), or one of each conductivity type FET with different $V_t$. Though FIGS. 1A-1C show three FETs, semiconductor device 100 can have any number of FETs. Also, though FIGS. 1A-1C show one gate stack opening 155, semiconductor device 100 can have additional gate stack openings similar and parallel to gate stack opening 155. The discussion of elements of FETs 105A, 105B, and 105C with the same annotations applies to each other, unless mentioned otherwise.

As shown in FIGS. 1A-1C, FETs 105A, 105B, and 105C can be formed on substrate 125. In some embodiments, substrate 125 can include a semiconductor material such as crystalline silicon. In some embodiments, substrate 125 can include (i) an elementary semiconductor, such as germanium (Ge); (ii) a compound semiconductor including silicon carbide (SiC), silicon arsenide (SiAs), gallium arsenide (GaAs), gallium phosphide (GaP), indium phosphide (InP), indium arsenide (InAs), indium antimonide (InSb), and/or a III-V semiconductor material; (iii) an alloy semiconductor including silicon germanium (SiGe), silicon germanium carbide (SiGeC), germanium stannum (GeSn), silicon germanium stannum (SiGeSn), gallium arsenic phosphide (GaAsP), gallium indium phosphide (GaInP), gallium indium arsenide (GaInAs), gallium indium arsenic phosphide (GaInAsP), aluminum indium arsenide (AlInAs), and/or aluminum gallium arsenide (AlGaAs); (iv) a silicon-on-insulator (SOI) structure; (v) a silicon germanium (SiGe)-on insulator structure (SiGeOI); (vi) germanium-on-insulator (GeOI) structure; or (vii) a combination thereof. Alternatively, the substrate can be made from an electrically non-conductive material, such as glass and sapphire wafer. Further, substrate 125 can be doped depending on design requirements (e.g., p-type substrate or n-type substrate). In some embodiments, substrate 125 can be doped with p-type dopants (e.g., boron, indium, aluminum, or gallium) or n-type dopants (e.g., phosphorus or arsenic). For example purposes, substrate 125 will be described in the context of crystalline silicon (Si). Based on the disclosure herein, other materials, as discussed above, can be used. These materials are within the spirit and scope of this disclosure.

Referring to FIGS. 1A-1C, semiconductor device 100 can include additional structural elements, such as fin structures 110, a liner 130, an insulating layer 135, source/drain (S/D) epitaxial fin structures 140, an etch stop layer 145, an isolation layer 150, a gate stack opening 155 formed in isolation layer 150, and gate spacers 160 formed on sidewall surfaces of isolation layer 150 in gate stack opening 155.

Fin structures 110A, 110B, and 110C (also collectively referred to as "fin structures 110") can include fin top portions 115A, 115B, and 115C (also collectively referred to as "fin top portions 115") and fin bottom portions 120A, 120B, and 120C (also collectively referred to as "fin bottom portions 120") respectively, as shown in FIGS. 1A-1C. In some embodiments, fin top portions 115 can be a single fin structure. In some embodiments, fin top portions 115 can include a stack of semiconductor layers (e.g., a stack of nanosheets, nanowires, or nano-fork sheets for GAA FETs). In some embodiments, fin top portions 115 can include semiconductor materials similar to or different from fin bottom portions 120. In some embodiments, fin top portions 115 and fin bottom portions 120 can include a semiconductor material the same as substrate 125, such as crystalline Si. In some embodiments, fin top portions 115 can include silicon germanium.

Fin structures 110 may be formed by patterning with any suitable method. For example, fin structures 110 may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. In some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern fin structures 110.

In some embodiments, insulating layer 135 can be an isolation structure, such as a shallow trench isolation (STI), that provides electrical isolation between FETs 105A, 105B, and 105C from each other and from neighboring FETs with different fin structures (not shown) on substrate 125 and/or neighboring active and passive elements (not shown) integrated with or deposited on substrate 125. In some embodiments, an insulating layer 135 can be a layer that functions as an electrical insulator (e.g., a dielectric layer). In some embodiments, insulating layer 135 can include silicon oxide ($SiO_2$), silicon nitride ($Si_3N_4$), silicon oxy-nitride (SION), fluorine-doped silicate glass (FSG), phosphorous-doped silicate glass (PSG), a low-k dielectric material (e.g., with k-value less than about 3.9), and/or other suitable dielectric materials with appropriate fill properties. In some embodiments, liner 130 is a nitride layer, such as silicon nitride.

Referring to FIGS. 1A-1C, S/D epitaxial fin structures 140 can be disposed on fin bottom portions 120 and abut gate spacers 160, extending along an X-axis within isolation layer 150. In some embodiments, S/D epitaxial fin structures 140 can have any geometric shape, such as a polygon, an ellipsis, and a circle. S/D epitaxial fin structures 140 can include an epitaxially-grown semiconductor material. In some embodiments, the epitaxially-grown semiconductor material includes the same material as substrate 125. In some embodiments, the epitaxially-grown semiconductor material includes a different material from substrate 125. In some embodiments, the epitaxially-grown semiconductor material for each of S/D epitaxial fin structures 140 can be the same as or different from each other. The epitaxially-grown semiconductor material can include: (i) a semiconductor material, such as germanium and silicon; (ii) a compound semiconductor material, such as gallium arsenide and aluminum gallium arsenide; or (iii) a semiconductor alloy, such as silicon germanium and gallium arsenide phosphide.

In some embodiments, S/D epitaxial fin structures 140 can be p-type for a PFET and n-type for an NFET. In some embodiments, p-type S/D epitaxial fin structures 140 can include SiGe and can be in-situ doped during an epitaxial growth process using p-type dopants, such as boron, indium, and gallium. In some embodiments, p-type S/D epitaxial fin structures 140 can have multiple sub-regions that can include SiGe and can differ from each other based on, for example, doping concentrations, epitaxial growth process conditions, and/or a relative concentration of Ge with respect to Si. In some embodiments, n-type S/D epitaxial fin structures 140 can include Si and can be in-situ doped during an epitaxial growth process using n-type dopants, such as phosphorus and arsenic. In some embodiments, n-type S/D epitaxial fin structures 140 can have multiple n-type epitaxial fin sub-regions that can differ from each other based on, for example, doping concentration and/or epitaxial growth process conditions.

Referring to FIGS. 1A-1C, fin structures 110A-110C can be current-carrying structures for respective FETs 105A, 105B, and 105C. Channel regions of FETs 105A, 105B, and 105C can be formed in portions of their respective fin top portions 115A, 115B, and 115C in gate stack opening 155. S/D epitaxial fin structures 140 can function as S/D regions of respective FETs 105A, 105B, and 105C.

Referring to FIGS. 1A-1C, etch stop layer 145 can extend over insulating layer 135, S/D epitaxial fin structures 140, and gate spacers 160. In some embodiments, etch stop layer 145 can function as a layer to stop etching in a subsequent etching process during the formation of S/D contact openings on S/D epitaxial fin structures 140. In some embodiments, etch stop layer 145 can be deposited by a conformal deposition process, such as atomic layer deposition (ALD), plasma-enhanced ALD (PEALD), chemical vapor deposition (CVD), plasma-enhanced CVD (PECVD), and any other suitable deposition method.

Isolation layer 150 can surround S/D epitaxial fin structures 140 and can be formed prior to the formation of gate stack opening 155. After the removal of sacrificial gate stacks (not shown), gate stack opening 155 can be formed in isolation layer 150, as shown in FIGS. 1A and 1B. In some embodiments, isolation layer 150 can be an interlayer dielectric (ILD) that includes a silicon oxide-based dielectric material with or without carbon and/or nitrogen. In some embodiments, isolation layer 150 can be deposited by CVD, physical vapor deposition (PVD), or any other suitable deposition method.

Gate spacers 160 can be a stack of one or more layers that include the same or different materials. In some embodiments, gate spacers 160 can include a dielectric material, such as silicon oxynitride (SiON), silicon carbon nitride (SiCN), silicon oxycarbide (SiOC), silicon nitride, or a combination thereof. According to some embodiments, gate spacers 160 can be deposited on sidewall surfaces of sacrificial gate stacks, which are later removed during a gate replacement process to form gate stack opening 155. In FIGS. 1A-1C, gate spacers 160 function as structural elements for the metal gate stack to be formed in gate stack opening 155 in subsequent processes.

Referring to FIG. 1C, semiconductor device 100 can further include boundaries 170 between FETs 105A and 105B and between FETs 105B and 105C. Boundaries 170 can be a boundary where gate dielectric layers of FET 105B border gate dielectric layers of FETs 105A or 105C, for example, high-k dielectric layer boundary between FET 105A and FET 105B. In some embodiments, boundaries 170 can be in the middle between fin structures 110A and 110B and between fin structures 110B and 110C. Fabrication processes of gate dielectric layer with controlled doping and metal stacks on fin structures 110A-110C will be described in details in FIGS. 2-5, 7A, and 8A. The fabrication processes also apply to the gate dielectric layer and metal stacks of FETs 105A, 105B, and 105C at boundaries 170, unless mentioned otherwise.

Figure 2:
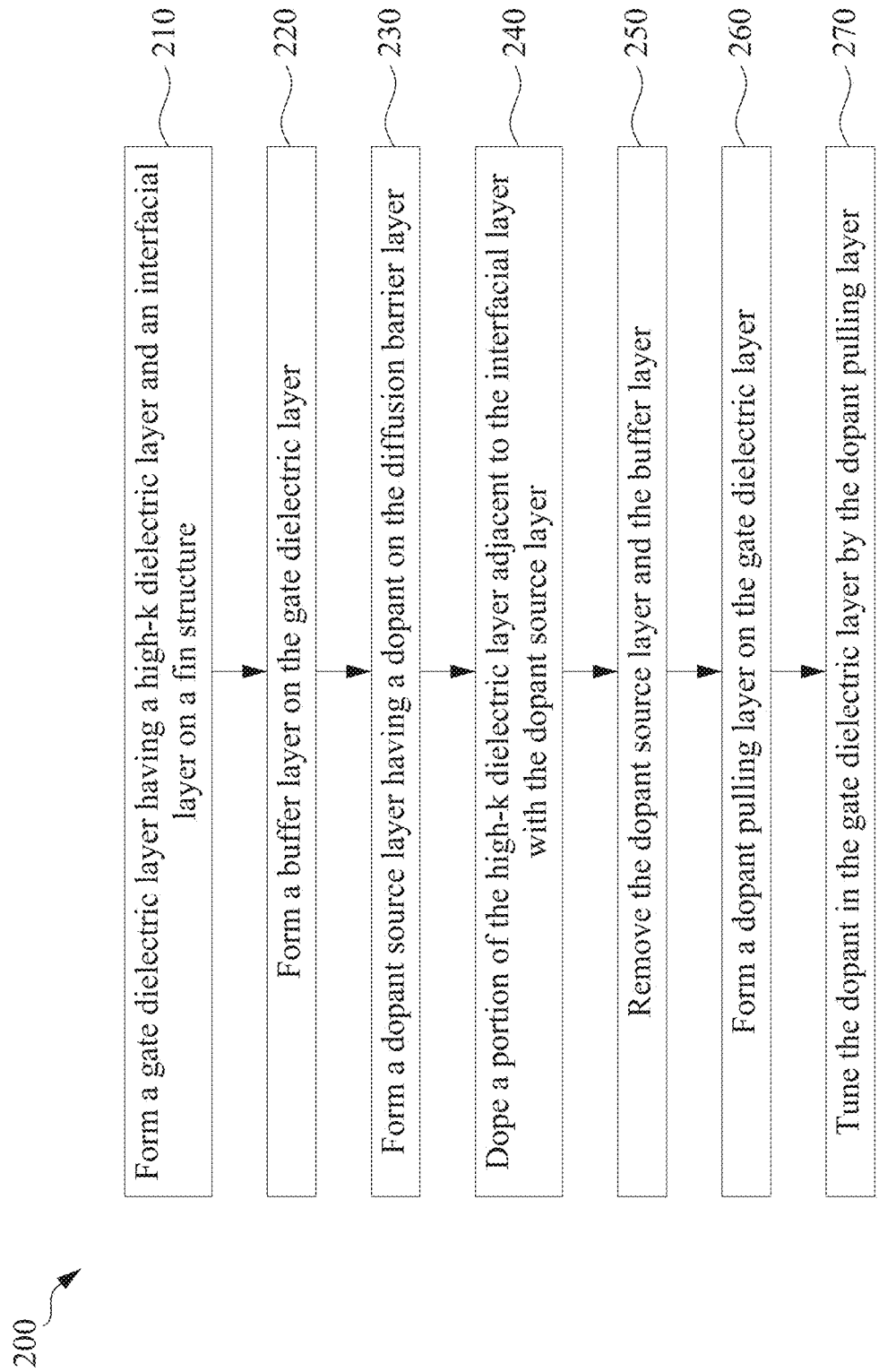
FIG. 2 is a flow diagram of a method for fabricating a semiconductor device having a gate dielectric layer with controlled doping, in accordance with some embodiments.

FIG. 2 is a flow diagram of method 200 for fabricating a semiconductor device having a gate dielectric layer with controlled doping, according to some embodiments. Method 200 may not be limited to finFET devices and can be applicable to devices that would benefit from controlled doping at the interface of the high-k dielectric layer and the interfacial layer of the gate dielectric layer, such as planar FETs, GAA FETs, etc. Additional fabrication operations may be performed between various operations of method 200 and may be omitted merely for clarity and ease of description. Additional processes can be provided before, during, and/or after method 200; one or more of these additional processes are briefly described herein. Moreover, not all operations may be needed to perform the disclosure provided herein. Additionally, some of the operations may be performed simultaneously or in a different order than shown in FIG. 2. In some embodiments, one or more other operations may be performed in addition to or in place of the presently described operations.

For illustrative purposes, the operations illustrated in FIG. 2 will be described with reference to the example fabrication process for fabricating semiconductor device 100 having a gate dielectric layer with controlled doping as illustrated in FIGS. 3A, 3B, 4, 5, 7A, and 8A. FIGS. 3A, 3B, 4, 5, 7A, and 8A illustrate partial cross-sectional views along a Y-axis of semiconductor device 100 having gate dielectric layer 303 with controlled doping at various stages of its fabrication process, in accordance with some embodiments. Although FIGS. 3A, 3B, 4, 5, 7A, and 8A illustrate controlled doping in gate dielectric layer 303 for semiconductor device 100, method 200 can be applied to other semiconductor devices, such as planar FETs, finFETs, and GAA FETs with different $V_t$. Elements in FIGS. 3A, 3B, 4, 5, 7A, and 8A with the same annotations as elements in FIGS. 1A-1C are described above.

Figure 3A:
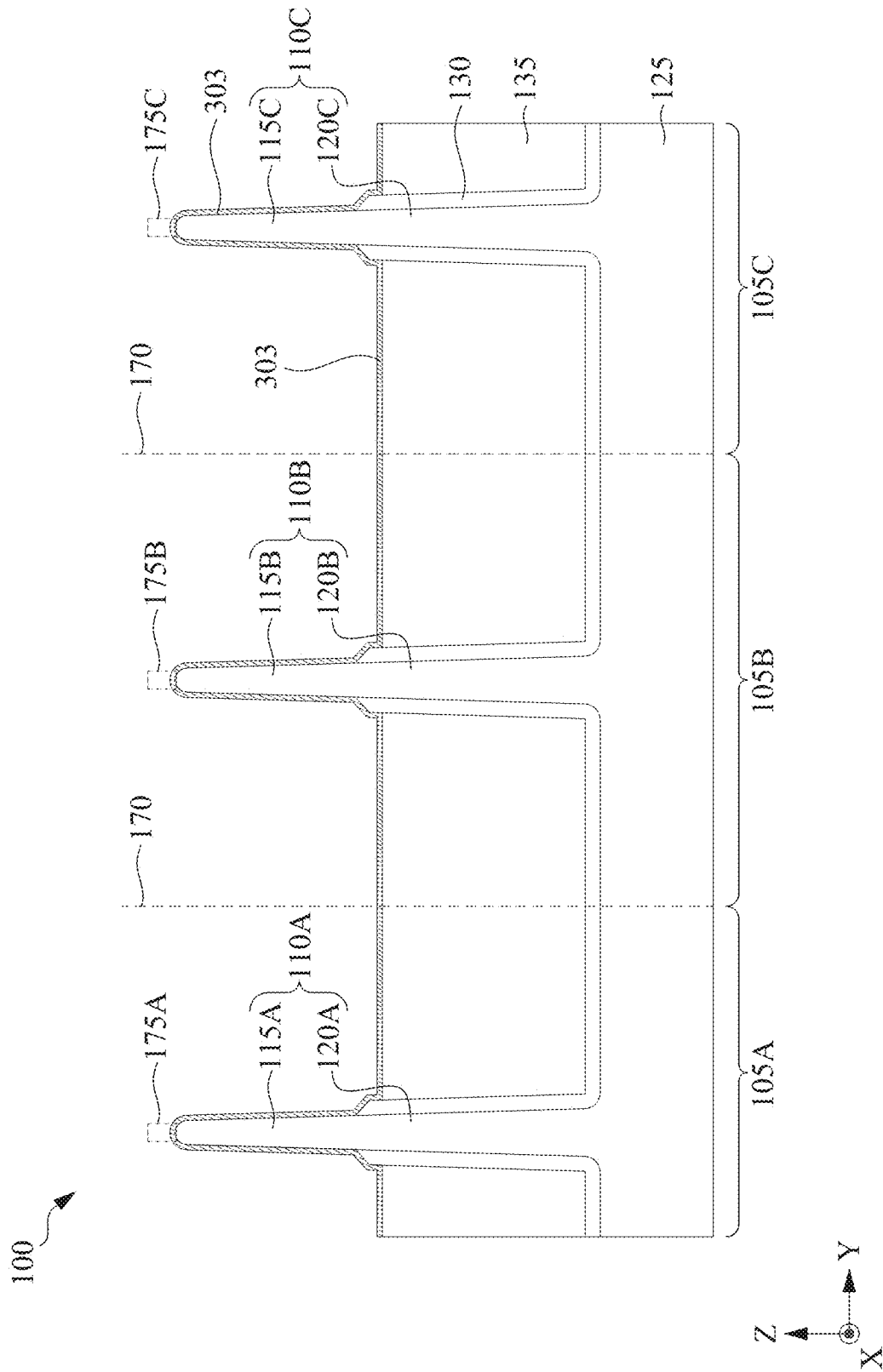

Referring to FIG. 2, method 200 begins with operation 210 and the process of forming gate dielectric layer 303 having a high-k dielectric layer 309 and an interfacial layer 307 on fin structures 110A-110C and insulating layer 135 between fin structures 110A-110C within gate stack opening 155 as shown in FIGS. 1A-1C. According to some embodiments, FIG. 3A is a cross-sectional view of semiconductor device 100 shown in FIG. 1C after operation 210 of method 200, FIG. 3B is an enlarged cross-sectional view of regions 175A-175C of semiconductor device 100 shown in FIG. 3A. Regions 175A-175C can represent the gate structures formed on fin structures 110A-110C respectively. In some embodiments, various gate structures formed on fin structures 110A-110C in FIGS. 3A and 3B can represent the gate structures formed on insulating layer 135 of FETs 105A, 105B, and 105C, respectively.

According to FIGS. 3A and 3B, gate dielectric layer 303 can be formed on fin structures 110 and insulating layer 135. Gate dielectric layer 303 can be formed in gate stack opening 155 between gate spacers 160 as shown in FIGS. 1A and 1B. In some embodiments, gate dielectric layer 303 can be a gate dielectric stack that includes interfacial layer 307 and high-k dielectric layer 309. In some embodiments, interfacial layer 307 can be formed by exposing the silicon surfaces of fin structures 110 to an oxidizing ambient. In some embodiments, the oxidizing ambient can include a combination of ozone ($O_3$), ammonia hydroxide/hydrogen peroxide/water mixture (SC1), and hydrochloric acid/hydrogen peroxide/water mixture (SC2). As a result of the aforementioned oxidation process, a silicon oxide layer between about 5 Å and about 15 Å can be formed on exposed silicon surfaces, such as the surfaces of fin structures 110 in gate stack opening 155, but not on insulating layer 135. Therefore, gate dielectric layer 303 on fin structures 110 can include interfacial layer 307 and high-k dielectric layer 309, and gate dielectric layer 303 on insulating layer 135 can include only high-k dielectric layer 309, according to some embodiments. In some embodiments, interfacial layer 307 can include a silicon oxide layer with a thickness from about 5 Å to about 15 Å and deposited by ALD, CVD, or any other suitable deposition method. As a result of the deposition process, the silicon oxide layer can cover fin structures 110 and insulating layer 135. In some embodiments, high-k dielectric layer 309 can include a dielectric material with a dielectric constant (k-value) higher than about 3.9. In some embodiments, high-k dielectric layer 309 can include hafnium oxide, aluminum oxide, zirconium oxide, or other suitable high-k dielectric materials deposited by ALD, CVD, or PEALD with a thickness from about 10 Å to about 75 Å.

Figure 4:
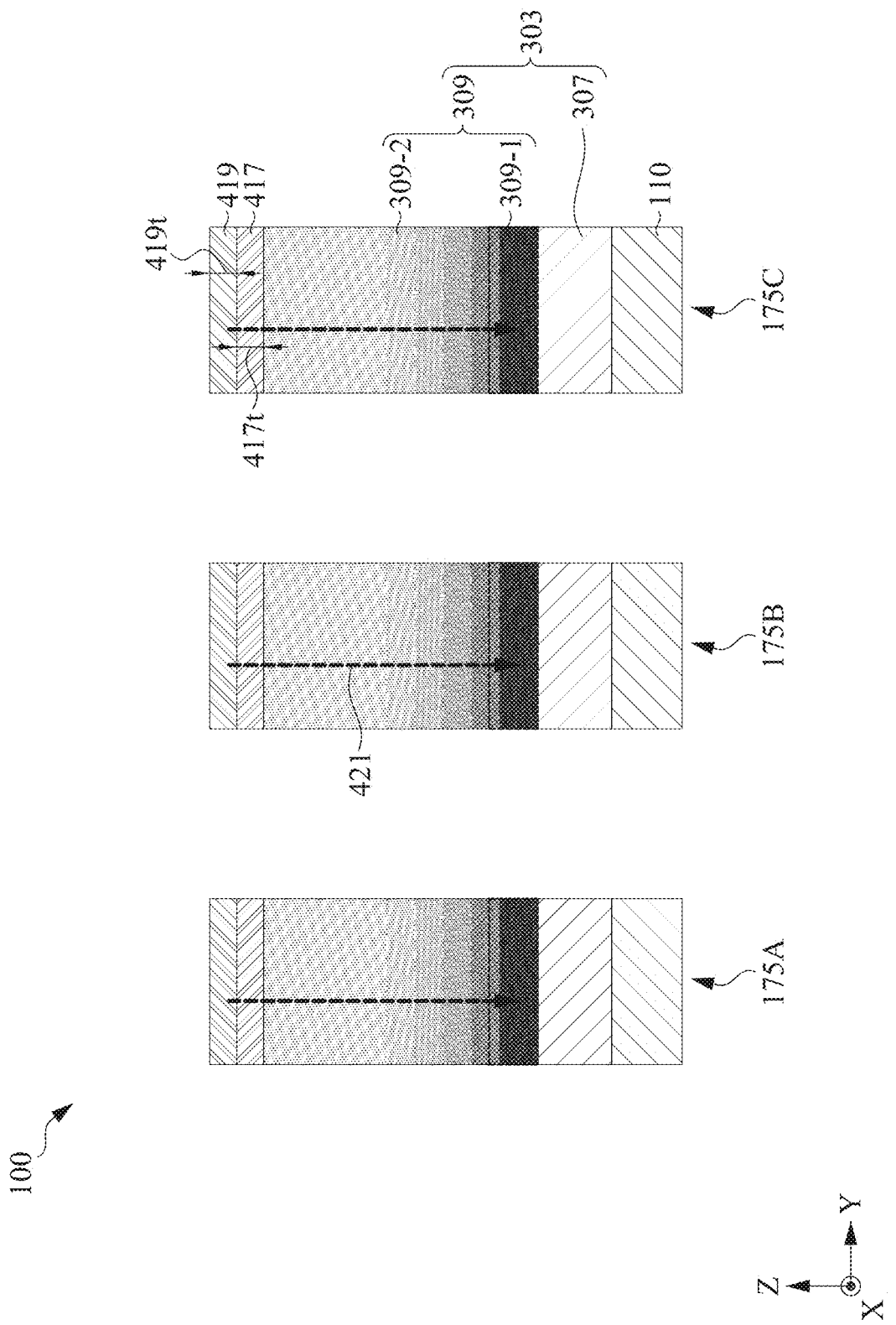

Referring to FIG. 2, method 200 continues with operation 220 and the process of forming a buffer layer on the gate dielectric layer. As shown in FIG. 4, buffer layer 417 can be formed on gate dielectric layer 303 at regions 175A-175C. Buffer layer 417 can be deposited by ALD, PEALD, CVD, or other suitable deposition methods. In some embodiments, the crystallinity of buffer layer 417 can be less than about 33%. If the crystallinity is greater than about 33%, more dopants can diffuse through buffer layer 417. In some embodiments, buffer layer 417 can include refractory metals, such as tungsten, metal nitrides such as titanium nitride, silicon nitride, tantalum nitride, and titanium silicon nitride, metal oxynitrides (e.g., titanium oxynitride and tantalum oxynitride), or other suitable materials. In some embodiments, buffer layer 417 can have a vertical dimension 417$t$ (e.g., thickness) along a Z-axis ranging from about 5 Å to about 80 Å. Buffer layer 417 can avoid direct contact and mixing of high-k dielectric layer 309 with a subsequently-deposited dopant source layer, thus preventing the formation of compound particle defects and allowing separate controlled etching of the dopant source layer and the buffer layer. If vertical dimension 417$t$ is less than about 5 Å, buffer layer 417 may not effectively block the diffusion of the dopant into gate dielectric layer 303 and mixing of high-k dielectric layer 309 with the subsequently-deposited dopant source layer. If vertical dimension 417$t$ is greater than about 80 Å, buffer layer 417 may totally block the diffusion of the dopant and the doping of gate dielectric layer 303.

In some embodiments, one or more of FETs 105A, 105B, and 105C can have different number of buffer layers, different total thicknesses of buffer layers, different compositions of buffer layers, or different percentage crystallinity of buffer layers at regions 175A-175C. The number of buffer layers or the total thickness of the buffer layers can control an amount of dopant diffusing through the buffer layers. For example, the greater the number of the buffer layers, or the thicker the buffer layers, the less the dopant diffuses through the buffer layer. The less dopant diffusing through the buffer layer results in smaller dipoles formed at the interface of interfacial layer 307 and high-k dielectric layer 309. The amount of dipoles formed at the interface of interfacial layer 307 and high-k dielectric layer 309 can control the V$_t$ shift of FETs 105A, 105B, and 105C. FETs with a different number of buffer layers, or different total thicknesses of buffer layers, can be achieved by photolithography and etching operations or by selective deposition operations.

Referring to FIG. 2, method 200 continues with operation 230 and the process of forming a dopant source layer having a dopant on the buffer layer. Referring to FIG. 4, dopant source layer 419 can be deposited on buffer layer 417 by ALD, CVD, PEALD, or other suitable deposition methods. Dopant source layer 419 can have a thickness 419$t$ along a Z-axis ranging from about 3 Å to about 300 Å. By way of example and not limitation, dopant source layer 419 can include aluminum oxide (AlO$_x$), magnesium oxide (MgO), lanthanum oxide (La$_2$O$_3$), lutetium oxide (Lu$_2$O$_3$), strontium oxide (SrO), zirconium oxide (ZrO$_2$), yttrium oxide (Y$_2$O$_3$), barium oxide, cerium oxide, gadolinium oxide, terbium oxide, erbium oxide, holmium oxide, dysprosium oxide, other suitable rare earth metal oxides, alkaline earth metal oxide, and transition metal oxides. In some embodiments, dopant source layer 419 including Y$_2$O$_3$, SrO, and Lu$_2$O$_3$ can be deposited on buffer layer 417 of n-type FETs. In some embodiments, dopant source layer 419 including Al$_2$O$_3$, TiO$_2$, and ZrO$_2$ can be deposited on buffer layer 417 of p-type FETs.

Referring to FIG. 2, method 200 continues with operation 240 and the process of doping a portion of the high-k dielectric layer adjacent to the interfacial layer with the dopant source layer. As shown in FIG. 4, the dopant in dopant source layer 419 can diffuse to the interface of high-k dielectric layer 309 and interfacial layer 307 under a thermal condition. A bottom portion 309-1 of high-k dielectric layer 309 adjacent to interfacial layer 307 can be doped with the dopant (also referred to as "doped portion 309-1"). Arrows 421 can indicate a direction of the diffusion of the dopant. In some embodiments, the dopant can diffuse through the buffer layers 417 to the interface by an isothermal anneal at an annealing temperature ranging from about 340° C. to about 850° C. The isothermal anneal can be performed in an inert gas environment, such as nitrogen and argon, at a pressure ranging from about 10 mtorr to about 780 torr for about 3 s to about 100 s.

After the doping process, the dopant can diffuse to the interface of high-k dielectric layer 309 and interfacial layer 307 and form dipoles at the interface. Depending upon the nature of the dopant used, the dipoles formed at the interface can attract electrons (or holes) in the channel under gate dielectric layer 303 and thus decrease V$_t$ for the NFET (or decrease V$_t$ for PFET). The dipoles at the interface can also repel holes in the channel and thus increase V$_t$ for the PFET (or increase V$_t$ for NFET).

Referring to FIG. 2, method 200 continues with operation 250 and the process of removing the dopant source layer and the buffer layer. For example, as shown in FIG. 5, dopant source layer 419 and buffer layer 417 can be removed by an etching process. In some embodiments, a wet chemical etching process can remove dopant source layer 419 at a temperature range from about 25° C. to about 300° C. after the doping process. Depending upon the type of dopant source layer 419, the wet chemical etching process can use an etchant including a combination of one or more of diluted hydrochloric acid (dHCl), hydrogen peroxide (H$_2$O$_2$), ammonia solution (NH$_4$OH), diluted hydrofluoric acid (dHF), deionized (DI) water, carbonated DI water, phosphoric acid (H$_3$PO$_4$), and other suitable etchants. In some embodiments, for dopant source layer 419 (e.g., aluminum oxide) on p-type FETs, the wet chemical etching process can use DI water and an etchant including NH$_4$OH, NH$_4$OH and HCl, or NH$_4$OH and H$_2$O$_2$. In some embodiments, for dopant source layer 419 (e.g., lanthanum oxide) on n-type FETs, the wet chemical etching process can use DI water and an etchant including dHCl or dHCl and H$_2$O$_2$. In some embodiments, the buffer layers 417 can protect high-k dielectric layer 309 during the removal of dopant source layer 419, thus avoiding non-uniform and/or excessive loss of high-k dielectric layer 309.

In some embodiments, a wet chemical etching process can remove buffer layer 417 at a temperature ranging from about 25° C. to about 300° C. after the removal of dopant source layer 419. The wet chemical etching process can use an etchant including NH$_4$OH and H$_2$O$_2$, an etchant including HCl and H$_2$O$_2$, an etchant including H$_2$O$_2$ and H$_3$PO$_4$, an etchant including hydrogen fluoride (HF), NH$_4$OH, and H$_2$O$_2$, or other suitable etchants. Buffer layer 417 can have a higher etch selectivity than the dopant source layer 419 with respect to the high-k dielectric layer 309. In some embodiments, the etch selectivity between the buffer layers 417 and the high-k dielectric layer 309 can range from about 450 to about 1000. As a result, excessive and/or non-uniform high-k dielectric layer 309 loss can be avoided and the buffer layers 417 and the dopant source layer 419 can be removed with higher etch selectivity and better process control compared with no buffer layer 417.

Referring to FIG. 2, method 200 continues with operation 260 and the process of forming a dopant pulling layer on the gate dielectric layer. For example, as shown in FIG. 5, dopant pulling layer 523 can be formed on gate dielectric layer 303. Dopant pulling layer 523 can include silicon or germanium and pull out the dopant in gate dielectric layer 303 under a thermal condition due to a high chemical affinity of the dopant for the silicon or germanium. As a result, dopant pulling layer 523 can control the dopant in gate dielectric layer 303 and thus $V_t$ shift in FETs 105A-105C. Different concentrations of silicon and/or germanium in dopant pulling layer 523 can tune $V_t$ differently to form multiple $V_t$ for different FETs. In some embodiments, dopant pulling layer 523 can include titanium silicon nitride ($Ti_xSi_yN$), titanium germanium nitride ($Ti_xGe_yN$), tantalum silicon nitride ($Ta_xSi_yN$), tantalum germanium nitride ($Ti_xGe_yN$), tungsten silicon nitride ($W_xSi_yN$), or tungsten germanium nitride ($W_xGe_yN$), where x and y are not negative numbers and a sum of x and y equals to 1. For example, dopant pulling layer 523 can include TiN, $Ti_xSi_yN$, SiN, $Ti_xGe_yN$, germanium nitride (GeN), titanium germanium nitride ($Ti_xSiGe_yN$), $Ta_xSi_yN$, $Ta_xGe_yN$, tantalum silicon germanium nitride ($Ta_xSiGe_yN$), tantalum nitride (TaN), $W_xSi_yN$, $W_xGe_yN$, tungsten silicon germanium nitride ($W_xSiGe_yN$), tungsten nitride (WN), tungsten carbon nitride (WCN), Si, Ge, SiGe, titanium silicide (TiSi), tantalum silicide (TaSi), tungsten silicide (WSi), or boron tungsten silicide (WSiB) that can have various Si and/or Ge concentrations. Dopant pulling layer 523 including TiN, WN, TaN, WCN without Si or Ge may not tune the dopant in gate dielectric layer 303.

In some embodiments, dopant pulling layer 523 can be deposited by ALD or other suitable methods at a temperature ranging from about 300° C. to about 550° C. In some embodiments, dopant pulling layer 523 can be deposited using silicon (Si) or germanium (Ge) precursors, metal precursors (e.g., titanium (Ti), tantalum (Ta), or tungsten (W)), and nitrogen (N) precursors. The Si precursors can include silane ($SiH_4$), disilane ($Si_2H_6$), dichlorosilane ($SiH_2Cl_2$), hexachlorodisilane ($Si_2Cl_6$), dimethyl dichlorosilane ($Si(CH_3)Cl_2$), TEOS ($Si(OC_2H_5)_4$), trichlorosilane ($SiHCl_3$), trichloro disilane ($Si_2H_3Cl_3$), hexa-methyl disilane (($Si(CH_3)_3)_2$), tetra-ethyl silane ($Si(C_2H_5)_4$), or other suitable Si precursors. The Ge precursors can include germane ($GeH_4$), digermane ($Ge_2H_6$), germanium tetrachloride ($GeCl_4$), or other suitable Ge precursors. The Ti precursors can include titanium tetrachloride ($TiCl_4$), tetrakis-dimethylamido-titanium (TDMAT, $Ti(N(CH_3)_2)_4$), tris(dimethylamido)-(dimethylamino-2-propanolato) titanium (TDMADT, $Ti(NMe_2)_3(dmap)$), or other suitable Ti precursors. The Ta precursors can include tantalum pentachloride ($TaCl_5$), PDMAT or other suitable Ta precursors. The W precursors can include tungsten chloride ($WCl_5$), tungsten fluoride ($WF_6$), Bis(tert-butylimino)bis(dibutylamino)tungsten, or other suitable W precursors. The N precursors can include ammonia ($NH_3$), hydrazine ($N_2H_4$), forming gas ($N_2+H_2$), $NH_3$ plasma, $N_2$ and $H_2$ plasma, cracked ammonia, or other suitable N precursors. In some embodiments, dopant pulling layer 523 can be deposited using precursors $TiCl_4$, $SiH_4$, and $NH_3$ at a temperature ranging from about 250° C. to about 550° C.

In some embodiments, dopant pulling layer 523 can have a vertical dimension 523t (e.g., thickness) along a Z-axis ranging from about 3 Å to about 80 Å. If vertical dimension 523t is less than about 3 Å, dopant pulling layer 523 may have uniformity issues and coverage issues and may not effectively tune the dopant concentration in gate dielectric layer 303. If vertical dimension 523t is greater than about 80 Å, tuning effect of dopant pulling layer 523 may saturate. In addition, dopant pulling layer 523 may have gap-filling issues and the cost for dopant pulling layer 523 may increase.

In some embodiments, dopant pulling layer 523 with a desired Si or Ge concentration can be deposited by controlling the precursor flow amount, pulse time, pulsing sequence, deposition time, and other suitable parameters. As shown in FIGS. 6A-6F, the Si or Ge concentration in dopant pulling layer 523 can be controlled by the pulsing sequences of the Si or Ge precursors, M precursors, and N precursors, where M precursors can include precursors of Ti, Ta, or W. Purge gas can be used between different precursor cycles to remove residues from the previous cycle. The precursor pulsing sequence in FIG. 6A can be Ti—N—Si—N. The precursor pulsing sequence in FIG. 6B can be Si—Ti—N. The precursor pulsing sequence in FIG. 6C can be Ti—Si—N. The precursor pulsing sequence in FIG. 6D can be Ti—(Si/N) with Si and N precursors co-flow. The precursor pulsing sequence in FIG. 6E can be Si—N—Si. The precursor pulsing sequence in FIG. 6F can be Ti—N—Ti. The Si concentrations in dopant pulling layer 523 deposited by these precursor pulsing sequences can range from high to low for Si—N—Si, Ti—N—Si—N, Si—Ti—N, Ti—Si—N, Ti—(Si/N), and Ti—N—Ti in a sequential order. For example, dopant pulling layer 523 can include $Ti_xSi_yN$ and a ratio of y to a sum of x and y can range from about 1 for Si—N—Si to about 0 for Ti—N—Ti.

In some embodiments, dopant pulling layer 523 can include at least two $Ti_xSi_yN$ layers with different Si concentrations for different FETs. In some embodiments, a first $Ti_xSi_yN$ layer can have a higher Si concentration with a Si precursor pulse time ranging from about 250 ms to about 25 s and a Ti precursor pulse time ranging from about 0 s to about 400 ms. A second $Ti_xSi_yN$ layer can have a lower Si concentration with a Si precursor pulse time ranging from about 0 s to about 250 ms and a Ti precursor pulse time ranging from about 20 ms to about 25 s. In some embodiments, dopant pulling layer 523 at region 175A can include $Ti_xSi_yN$ with a ratio of y to a sum of x and y ranging from about 0.3 to about 0.6. Dopant pulling layer 523 at region 175B can include $Ti_xSi_yN$ with a ratio of y to a sum of x and y ranging from about 0.7 to about 1 (e.g., SiN). Dopant pulling layer 523 at region 175C can include $Ti_xSi_yN$ with a ratio of y to a sum of x and y ranging from about 0 to about 0.29 (e.g., TiN).

Referring to FIG. 2, method 200 continues with operation 270 and the process of tuning the dopant in the gate dielectric layer by the dopant pulling layer. For example, as shown in FIG. 7A-7C, the dopant in gate dielectric layer 303 can be tuned by dopant pulling layer 523 under a thermal condition. High-k dielectric layer 309 can have doped portion 309-1, bulk portion 309-2, and a top portion 309-3 after the tuning process. In some embodiments, dopant pulling layer 523 can pull out the dopant by an isothermal anneal at an annealing temperature ranging from about 350° C. to about 900° C. The isothermal anneal can be performed in an inert gas environment, such as nitrogen and argon, at a pressure ranging from about 10 mtorr to about 780 torr for about 3 s to about 100 s.

After the tuning process, top portion 309-3 of high-k dielectric layer 309 adjacent to dopant pulling layer 523 can intermix with dopant pulling layer 523 as shown in FIG. 7A (also referred to as "intermixing layer 309-3"). In some embodiments, intermixing layer 309-3 can prevent metal diffusion (e.g., Al) from a subsequently-deposited gate electrode to gate dielectric layer 303. Metal diffusion to gate dielectric layer 303 can degrade device reliability, increase device leakage, and shift the $V_t$ of the FET device. The dopant in doped portion 309-1 can be tuned by the silicon or germanium in dopant pulling layer 523 under the thermal condition. FIG. 7B illustrates the silicon or germanium concentration in dopant pulling layer 523 and gate dielectric layer 303 at regions 175A-175C after the tuning process, according to some embodiments. FIG. 7C illustrates the dopant concentration in dopant pulling layer 523 and gate dielectric layer 303 at regions 175A-175C after the tuning process, according to some embodiments. The dotted lines across FIGS. 7A-7C can illustrate the correspondence between the concentration profiles and each layer at regions 175A-175C.

Referring to FIG. 7B, intermixing layer 309-3 can have different thicknesses and different Si or Ge concentrations due to different Si or Ge concentrations in dopant pulling layer 523 at regions 175A-175C. Dopant pulling layer 523 at region 175A can have a moderate Si concentration. Dopant pulling layer 523 at region 175B can have a higher Si concentration. Dopant pulling layer 523 at region 175C can have a lower Si concentration. As a result, intermixing layer 309-3 at region 175A can have a thickness 309-3t along a Z-axis ranging from about 3 Å to about 8 Å. The Si concentration in intermixing layer 309-3 at region 175A can range from about 5% to about 12%. Intermixing layer 309-3 at region 175B can have a thickness 309-3t along a Z-axis ranging from about 10 Å to about 15 Å. The Si concentration in intermixing layer 309-3 at region 175B can range from about 12% to about 30%. Intermixing layer 309-3 at region 175C can have a thickness 309-3t along a Z-axis ranging from about 0 Å to about 3 Å. The Si concentration in intermixing layer 309-3 at region 175C can range from about 0% to about 5%.

Referring to FIG. 7C, regions 175A-175C can have different dopant concentration profiles due to different Si or Ge concentrations in dopant pulling layer 523. For example, as shown in FIGS. 7A-7C, doped portion 309-1 at region 175A can have a moderate dopant concentration compared to regions 175B and 175C due to the moderate Si concentration in dopant pulling layer 523 at region 175A. In addition, a ratio of the dopant concentration in bulk portion 309-2 to doped portion 309-1 at region 175A can range from about 0.8 to about 1.4. Doped portion 309-1 at region 175B can have a lower dopant concentration than regions 175A and 175C due to a higher Si concentration in dopant pulling layer 523 at region 175B. In addition, a ratio of the dopant concentration in bulk portion 309-2 to doped portion 309-1 at region 175B can be greater than about 1.4. Doped portion 309-1 at region 175C can have a higher dopant concentration than regions 175A and 175B due to lower Si concentration in dopant pulling layer 523 at region 175C. In addition, a ratio of the dopant concentration in bulk portion 309-2 to doped portion 309-1 at region 175C can range from about 0.1 to about 0.8. In some embodiments, the lower dopant concentration in doped portion 309-1 at region 175B can lead to smaller dopant dipoles at the interface of high-k dielectric layer 309 and interfacial layer 307, which can tune FET 105B to have a smaller $V_t$ shift (e.g., about 28 mV or less).

Figure 10:
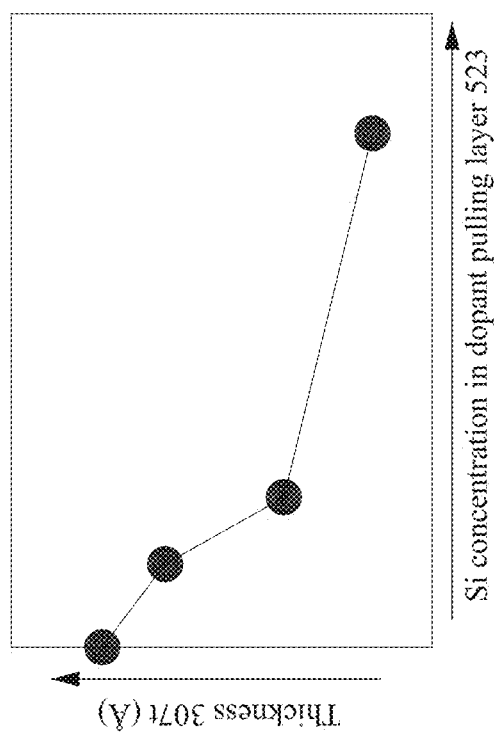
FIG. 10 illustrates a relationship between a thickness of an interfacial layer and a concentration of silicon in a dopant pulling layer, in accordance with some embodiments.

In some embodiments, dopant pulling layer 523 can pull out oxygen from interfacial layer 307 and thus reduce the thickness of gate dielectric layer 303. As shown in FIG. 7A, for dopant pulling layer 523 having different Si or Ge concentrations, interfacial layer 307 can have different thicknesses at regions 175A-175C after the tuning process. For example, for dopant pulling layer 523 having moderate Si concentration at region 175A, interfacial layer 307 can have a thickness 307t along a Z-axis ranging from about 5 Å to about 16 Å. For dopant pulling layer 523 having higher Si concentration at region 175B, thickness 307t of interfacial layer 307 can range from about 3 Å to about 13 Å. For dopant pulling layer 523 having lower Si concentration at region 175C, thickness 307t of interfacial layer 307 can range from about 7 Å to about 20 Å. As a result, thickness 307t of interfacial layer 307 can decrease with the increase of Si concentration in dopant pulling layer 523, as shown in FIG. 10.

The tuning of the dopant in gate dielectric layer 303 can be followed by the removal of dopant pulling layer 523, as shown in FIGS. 8A-8C. In some embodiments, dopant pulling layer 523 can be removed by a wet etching process at a temperature ranging from about 25° C. to about 300° C. The wet chemical etching process can use an etchant including $NH_4OH$ and $H_2O_2$, an etchant including HCl and $H_2O_2$, an etchant including $H_2O_2$ and $H_3PO_4$, an etchant including hydrogen fluoride (HF), $NH_4OH$, and $H_2O_2$, an etchant including $H_2O_2$ and HCl, or other suitable etchants. After the removal of dopant pulling layer 523, the Si concentration profiles in FIG. 8B and dopant concentration profiles in FIG. 8C for each layer of gate dielectric layer 303 are similar to those profiles shown in FIG. 7B and FIG. 7C, respectively.

Figure 9B:
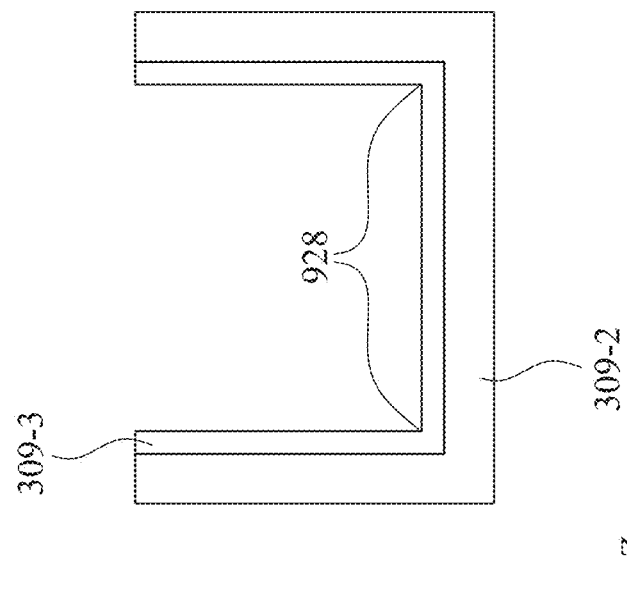
FIGS. 9A-9C illustrate distributions of the dopant at different regions of a semiconductor device with controlled doping, in accordance with some embodiments.
Figure 9A:
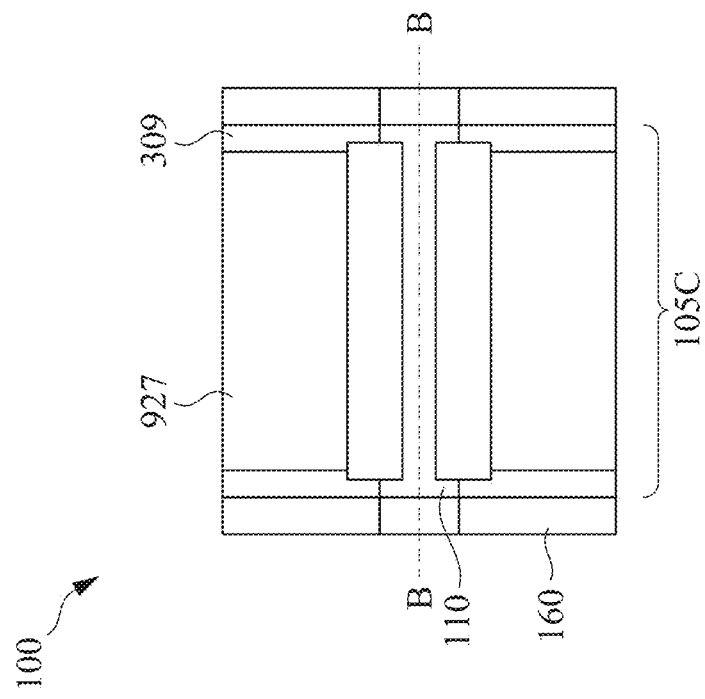
Figure 9C:
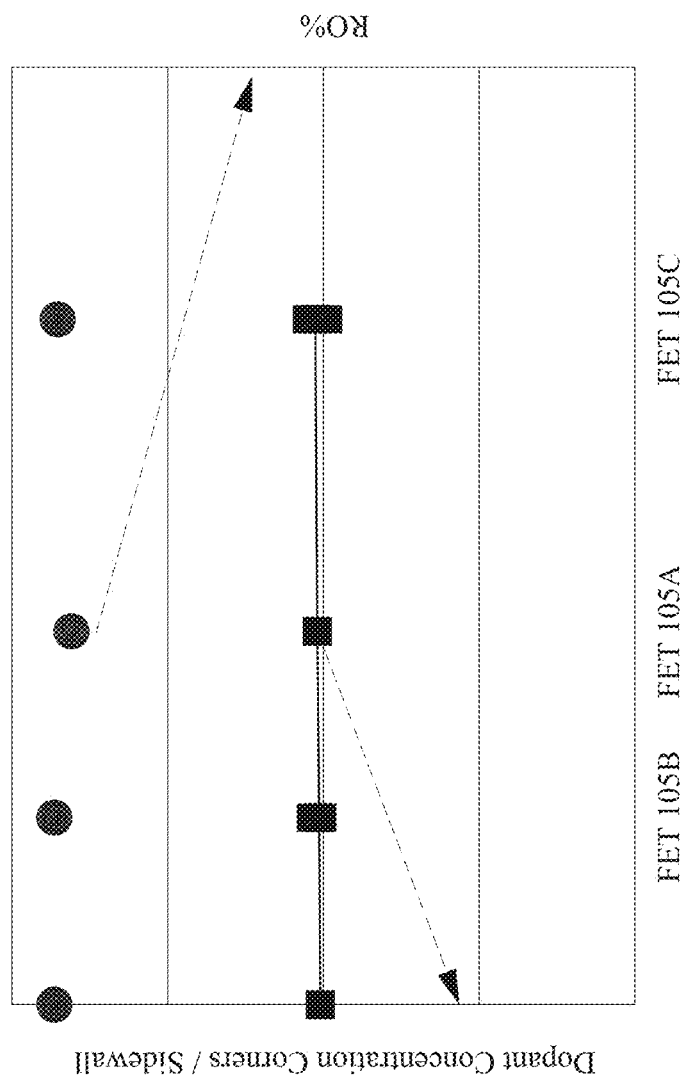

With dopant pulling layer 523 and buffer layer 417, the dopant can have uniform distribution along the channel region of fin structures 110 and gate spacers 160 of FETs 105A-105C in semiconductor device 100, as shown in FIGS. 9A-9C. FIG. 9A illustrates a partial top-down view of FET 105C in semiconductor device 100 with controlled doping in gate dielectric layer 303 after deposition of a gate electrode 927, in accordance with some embodiments. FIG. 9B illustrates a partial cross-sectional view of FET 105C along line B-B in FIG. 9A, in accordance with some embodiments. As shown in FIGS. 9A and 9B, corners 928 can have essentially no residues after the removal of dopant pulling layer 523 and FET 105C can have uniform $V_t$ and thus uniform carrier distribution along the channel region of fin structures 110. FIG. 9C illustrates ratios of dopant concentration at corners 928 to sidewalls of high-k dielectric layer 309 and ring oscillator yield percentages (RO %) for FETs 105A-105C, according to some embodiments. As shown in FIG. 9C, FETs 105A-105C can have uniform dopant distributions at corners 928 and sidewalls of high-k dielectric layer 309, and similar RO %.

Figure 11:
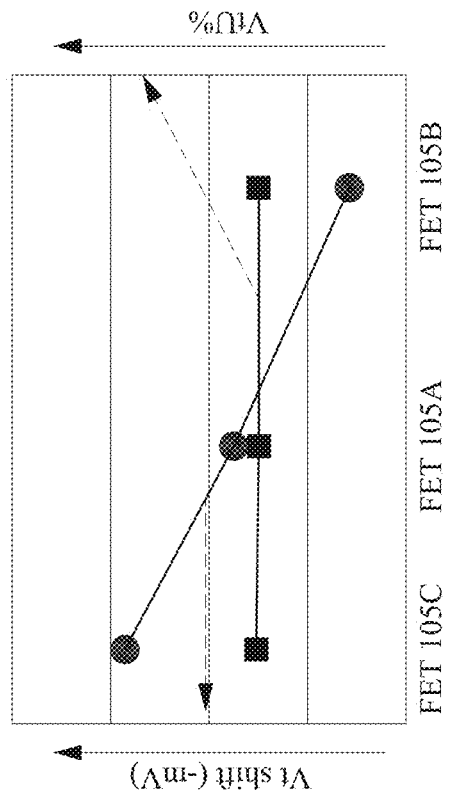
FIG. 11 illustrates threshold voltage shifts and threshold voltage uniformity of a semiconductor device tuned by a dopant pulling layer with different silicon or germanium concentrations, in accordance with some embodiments.

FIG. 11 illustrates threshold voltage shifts ($V_t$ shifts) and threshold voltage uniformity ($V_t$U %) of FETs 105A-105C in semiconductor device 100 with dopant tuning by dopant pulling layer 523, according to some embodiments. As shown in FIG. 11, with lower dopant concentration in doped portion 309-1 of FET 105B, smaller dopant dipoles can form at the interface of high-k dielectric layer 309 and interfacial layer 307, which can tune FET 105B to have a smaller $V_t$ shift (e.g., about 28 mV or less). In addition, with dopant pulling layer 523 and buffer layer 417, FETs 105A-105C can have uniform dopant distribution and thereby uniform $V_t$.

FIG. 12 illustrates a partial cross-sectional view at boundaries 170 between FETs 105B and 105C having dielectric layers with controlled doping after deposition of a first gate electrode layer 1229 and a second gate electrode layer 1231, in accordance with some embodiments. In some embodiments, first gate electrode layer 1229 can include a p-type work function layer and second gate electrode layer 1231 can include an n-type work function layer. As shown in FIG. 12, at the interface of high-k dielectric layer 309 and interfacial layer 307, the dopants in doped portion 309-1 can form dipoles. As the dipoles are immobile, the dopant at the interface may not diffuse across boundaries 170 to adjacent FETs. The dopants in bulk portion 309-2 of FETs 105B and 105C can have similar dopant concentrations, as shown in FIGS. 7C and 8C. Therefore, the dopant in bulk portion 309-2 of FETs 105B and 105C may not diffuse across boundaries 170 to adjacent FETs. The dopant can have high affinity for the silicon and intermixing layer 309-3 can include Si. Therefore, the dopant in intermixing layer 309-3 of FETs 105B and 105C may be bonded to Si and may not diffuse across boundaries 170 to adjacent FETs.

Because of the immobile dopants in gate dielectric layer 303 of FETs 105B and 105C with controlled doping, the dopants of adjacent FETs 105B and 105C can be isolated and the boundary effect of dopant diffusion across boundaries 170 can be mitigated. The discussion of reduced dopant diffusion across boundaries 170 also applies to FET 105A and other devices. In some embodiments, without dopant control by dopant pulling layer 523 and buffer layer 417, $V_t$ shift of active FETs 105A, 105B, or 105C with adjacent dummy devices due to a boundary effect can range from about −15 mV to about 16 mV. In some embodiments, with dopant control of dopant pulling layer 523 and buffer layer 417, $V_t$ shift of active FETs 105A, 105B, or 105C with adjacent dummy devices can range only from about −1 mV to about 0 mV, due to the decreasing of dopant diffusion across boundaries 170 and mitigation of the boundary effect.

Figure 13D:
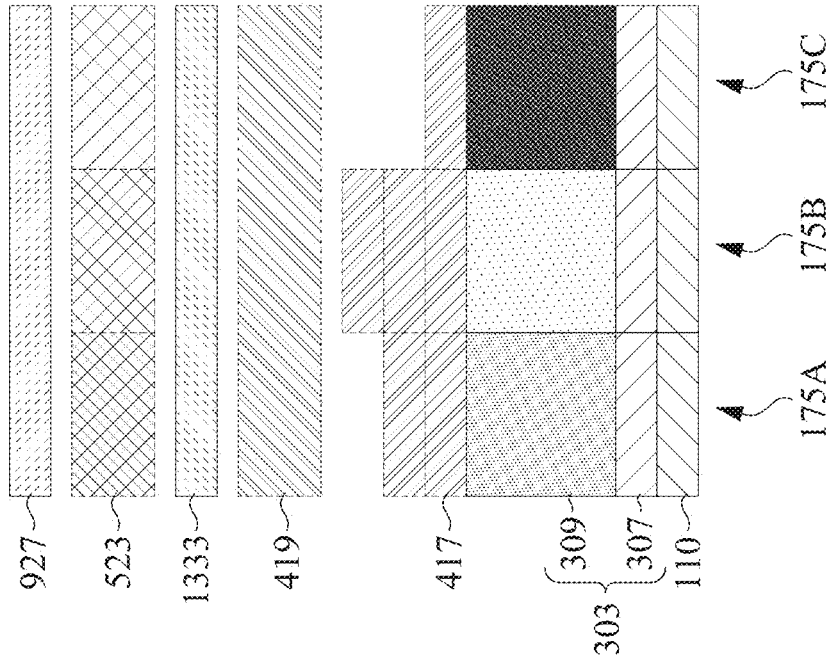

FIGS. 13A-13H illustrate various embodiments of forming semiconductor device 100 having gate dielectric layer 303 with controlled doping, in accordance with some embodiments. As shown in FIGS. 13A-13H, dotted layers can be removed during the fabrication process and solid layers can stay in the device after the fabrication process. Different embodiments can represent different fabrication processes to fabricate semiconductor device 100. In some embodiments, as shown in FIG. 13A, buffer layer 417 and dopant source layer 419 can be deposited on gate dielectric layer 303 to diffuse a dopant to the interface of high-k dielectric layer 309 and interfacial layer 307. Each of buffer layer 417 and dopant source layer 419 can have a same thickness at regions 175A-175C. After the removal of buffer layer 417 and dopant source layer 419, an additional high-k dielectric layer 1333 can be optionally deposited on gate dielectric layer 303 and can be a part of gate dielectric layer 303. Dopant pulling layer 523 can be deposited on gate dielectric layer 303 to control the dopant at the interface. Dopant pulling layer 523 can have different concentrations of Si or Ge at regions 175A-175C. The dopant concentration and the dopant dipoles can be different at the interface for regions 175A-175C due to the different concentrations of Si or Ge in dopant pulling layer 523. After the removal of dopant pulling layer 523, gate electrode 927 can be deposited on gate dielectric layer 303. The fabrication processes in FIG. 13A can be described in details in method 200.

In some embodiments, as shown in FIG. 13B, buffer layer 417 and dopant source layer 419 can be deposited on gate dielectric layer 303 at regions 175A-175C to diffuse a dopant to the interface of high-k dielectric layer 309 and interfacial layer 307. Each of buffer layer 417 and dopant source layer 419 can have a same thickness at regions 175A-175C. After the removal of buffer layer 417 and dopant source layer 419, an additional high-k dielectric layer 1333 can be optionally deposited on gate dielectric layer 303 and can be a part of gate dielectric layer 303. Dopant pulling layer 523 can be deposited on gate dielectric layer 303 to control the dopant at the interface. Dopant pulling layer 523 can have different concentrations of Si or Ge at regions 175A-175C. The dopant concentration and the dopant dipoles can be different at the interface for regions 175A-175C due to the different concentrations of Si or Ge in dopant pulling layer 523. Without removal of dopant pulling layer 523, gate electrode 927 can be deposited on dopant pulling layer 523. The deposition and removal of each layer can be similar to those operations described in method 200.

Figure 13C:
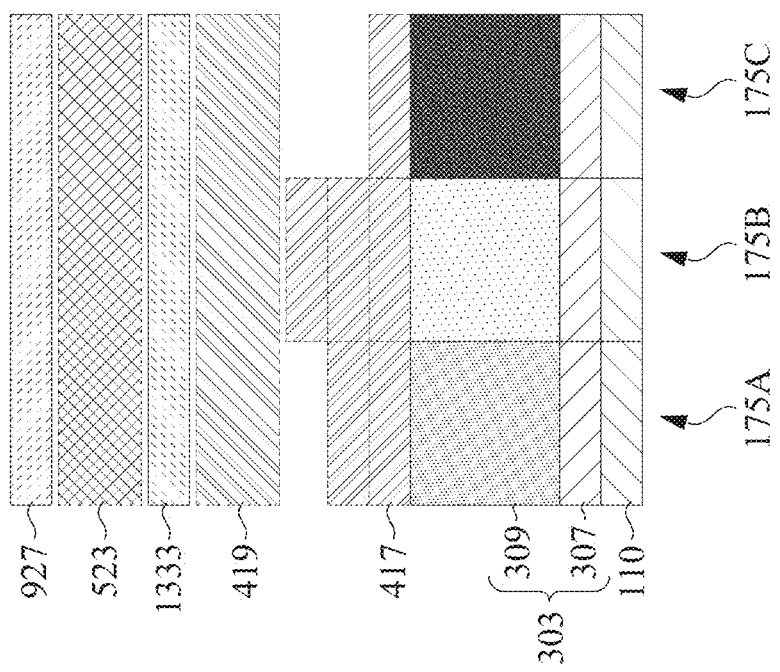

In some embodiments, as shown in FIG. 13C, buffer layer 417 and dopant source layer 419 can be deposited on gate dielectric layer 303 at regions 175A-175C to diffuse a dopant to the interface of high-k dielectric layer 309 and interfacial layer 307. Buffer layer 417 can have different number of buffer layers or different total thickness of buffer layers at regions 175A-175C. Dopant source layer 419 can have a same thickness at regions 175A-175C. After the removal of buffer layer 417 and dopant source layer 419, an additional high-k dielectric layer 1333 can be optionally deposited on gate dielectric layer 303 and can be a part of gate dielectric layer 303. Dopant pulling layer 523 can be deposited on gate dielectric layer 303 to control the dopant at the interface. Dopant pulling layer 523 can have a same concentration of Si at regions 175A-175C. As buffer layer 417 can have different number of buffer layers or different total thickness of buffer layers at regions 175A-175C, the dopant concentration and the dopant dipoles can be different at the interface for regions 175A-175C, though dopant pulling layer 523 at regions 175A-175C have a same concentration of Si. After the removal of dopant pulling layer 523, gate electrode 927 can be deposited on gate dielectric layer 303. The deposition and removal of each layer can be similar to those operations described in method 200.

In some embodiments, as shown in FIG. 13D, buffer layer 417 and dopant source layer 419 can be deposited on gate dielectric layer 303 at regions 175A-175C to diffuse a dopant to the interface of high-k dielectric layer 309 and interfacial layer 307. Buffer layer 417 can have different number of buffer layers or different total thickness of buffer layers at regions 175A-175C. Dopant source layer 419 can have a same thickness at regions 175A-175C. After the removal of buffer layer 417 and dopant source layer 419, an additional high-k dielectric layer 1333 can be optionally deposited on gate dielectric layer 303 and can be a part of gate dielectric layer 303. Dopant pulling layer 523 can be deposited on gate dielectric layer 303 to control the dopant at the interface. Dopant pulling layer 523 can have different concentrations of Si or Ge at regions 175A-175C. The dopant concentration and the dopant dipoles can be different at the interface for regions 175A-175C due to the different concentrations of Si or Ge in dopant pulling layer 523 and different total thickness of buffer layer 417. After the removal of dopant pulling layer 523, gate electrode 927 can be deposited on gate dielectric layer 303. The deposition and removal of each layer can be similar to those operations described in method 200.

Figure 13E:
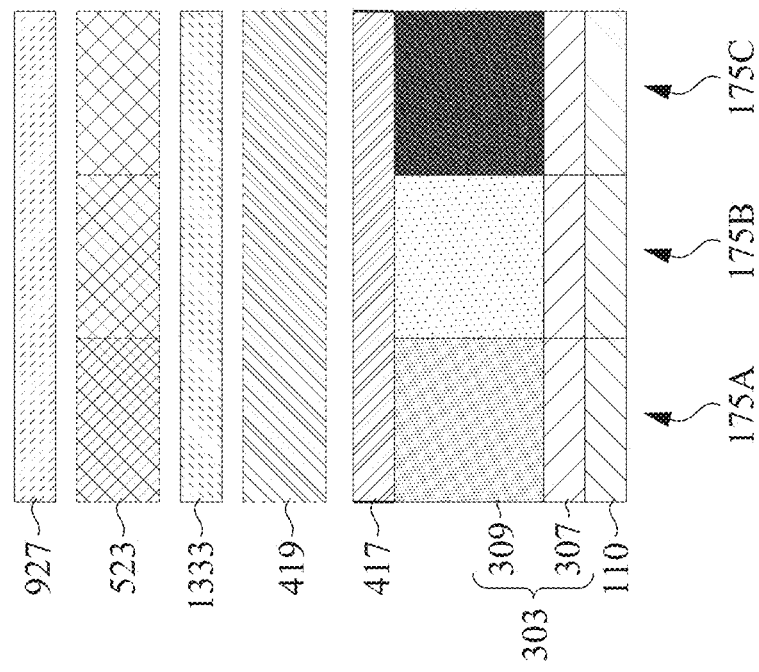

In some embodiments, as shown in FIG. 13E, buffer layer 417 and dopant source layer 419 can be deposited on gate dielectric layer 303 at regions 175A-175C to diffuse a dopant to the interface of high-k dielectric layer 309 and interfacial layer 307. Buffer layer 417 can have different number of buffer layers or different total thickness of buffer layers at regions 175A-175C. Dopant source layer 419 can have a same thickness at regions 175A-175C. After the removal of buffer layer 417 and dopant source layer 419, an additional high-k dielectric layer 1333 can be optionally deposited on gate dielectric layer 303 and can be a part of gate dielectric layer 303. Dopant pulling layer 523 can be deposited on gate dielectric layer 303 to control the dopant at the interface. Dopant pulling layer 523 can have different concentrations of Si or Ge at regions 175A-175C. The dopant concentration and the dopant dipoles can be different at the interface for regions 175A-175C due to the different concentrations of Si or Ge in dopant pulling layer 523 and different total thickness of buffer layer 417. Without removal of dopant pulling layer 523, gate electrode 927 can be deposited on dopant pulling layer 523. The deposition and removal of each layer can be similar to those operations described in method 200.

Figure 13F:
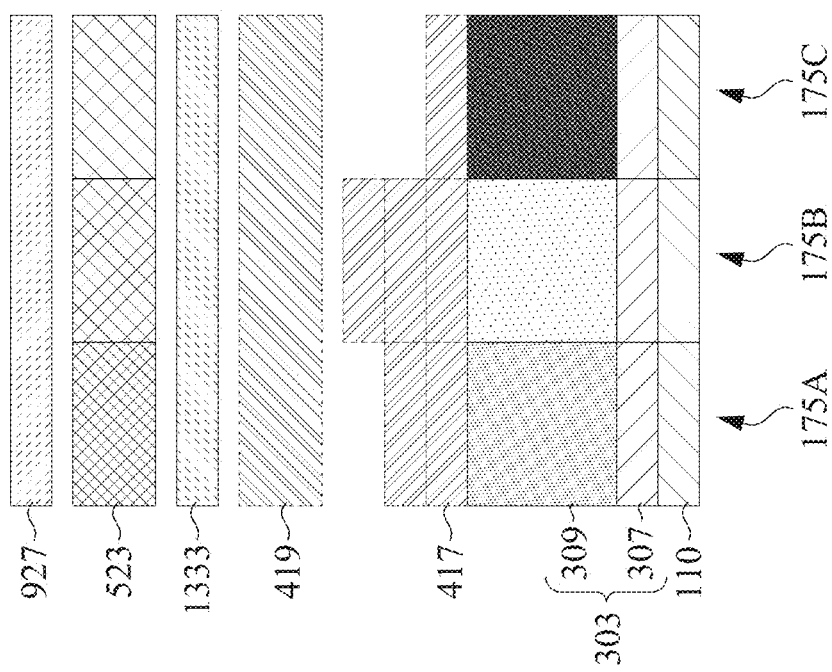

In some embodiments, as shown in FIG. 13F, buffer layer 417 and dopant source layer 419 can be deposited on gate dielectric layer 303 at regions 175A-175C to diffuse a dopant to the interface of high-k dielectric layer 309 and interfacial layer 307. Each of buffer layer 417 and dopant source layer 419 can have a same thickness at regions 175A-175C. Buffer layer 417 may not be removed. After the removal of dopant source layer 419, an additional high-k dielectric layer 1333 can be optionally deposited on buffer layer 417. Buffer layer 417 and the additional high-k dielectric layer 1333 can be a part of gate dielectric layer 303. Dopant pulling layer 523 can be deposited on gate dielectric layer 303 to control the dopant at the interface. Dopant pulling layer 523 can have different concentrations of Si or Ge at regions 175A-175C. The dopant concentration and the dopant dipoles can be different at the interface for regions 175A-175C due to the different concentrations of Si or Ge in dopant pulling layer 523. After the removal of dopant pulling layer 523, gate electrode 927 can be deposited on gate dielectric layer 303. The deposition and removal of each layer can be similar to those operations described in method 200.

In some embodiments, as shown in FIG. 13G, buffer layer 417 and dopant source layer 419 can be deposited on gate dielectric layer 303 at regions 175A-175C to diffuse a dopant to the interface of high-k dielectric layer 309 and interfacial layer 307. Each of buffer layer 417 and dopant source layer 419 can have a same thickness at regions 175A-175C. Buffer layer 417 at region 175B can be removed and buffer layer 417 at regions 175A and 175C may not be removed. After the removal of dopant source layer 419, an additional high-k dielectric layer 1333 can be optionally deposited on buffer layer 417. Buffer layer 417 and the additional high-k dielectric layer 1333 can be a part of gate dielectric layer 303. Dopant pulling layer 523 can be deposited on gate dielectric layer 303 to control the dopant at the interface. Dopant pulling layer 523 at regions 175A and 175B can have a same concentration of Si, and dopant pulling layer 523 at region 175C can have a different concentration of Si. As buffer layer 417 at region 175B can be removed, the dopant concentration and the dopant dipoles can be different at the interface for regions 175A and 175B, though dopant pulling layer 523 at regions 175A and 175B have a same concentration of Si. After the removal of dopant pulling layer 523, gate electrode 927 can be deposited on gate dielectric layer 303. The deposition and removal of each layer can be similar to those operations described in method 200.

In some embodiments, as shown in FIG. 13H, buffer layer 417 and dopant source layer 419 can be deposited on gate dielectric layer 303 at regions 175A-175C to diffuse a dopant to the interface of high-k dielectric layer 309 and interfacial layer 307. Each of buffer layer 417 and dopant source layer 419 can have a same thickness at regions 175A-175C. Buffer layer 417 at region 175B can be removed after the removal of dopant source layer 419. Buffer layer 417 at regions 175A and 175C may not be removed after the removal of dopant source layer 419. After the removal of dopant source layer 419, an additional high-k dielectric layer 1333 can be optionally deposited on buffer layer 417. Buffer layer 417 and the additional high-k dielectric layer 1333 can be a part of gate dielectric layer 303. Dopant pulling layer 523 can be deposited on gate dielectric layer 303 to control the dopant at the interface. Dopant pulling layer 523 at regions 175A and 175B can have a same concentration of Si, and dopant pulling layer 523 at region 175C can have a different concentration of Si. Buffer layer 417 at region 175A can be removed after the removal of dopant pulling layer 523. As buffer layer 417 at regions 175A and 175B can be removed at different points in the process, the dopant concentration and the dopant dipoles can be different at the interface for regions 175A and 175B, though dopant pulling layer 523 at regions 175A and 175B have a same concentration of Si. After the removal of dopant pulling layer 523, gate electrode 927 can be deposited on gate dielectric layer 303. The deposition and removal of each layer can be similar to those operations described in method 200.

Figure 14A:
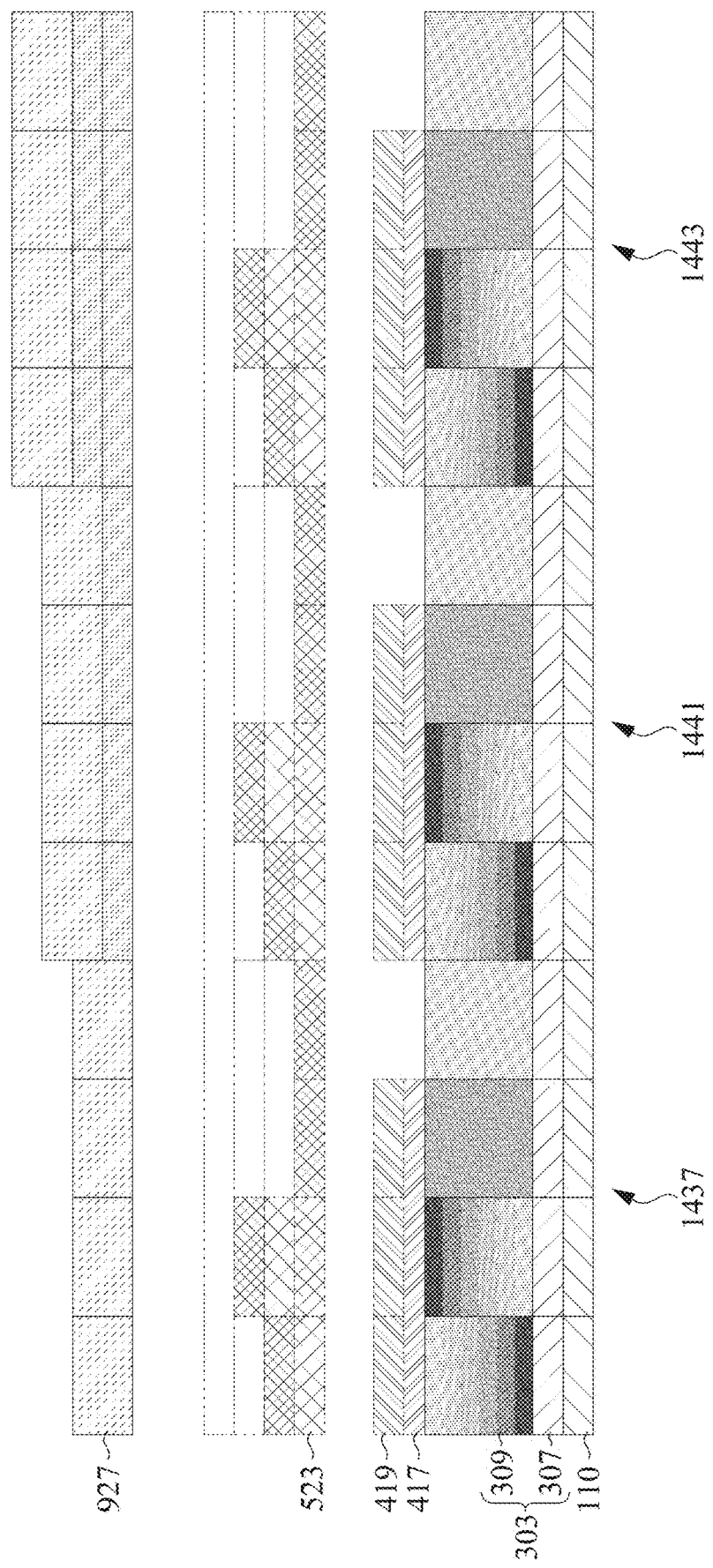
FIGS. 14A-14B illustrate various embodiments of forming semiconductor devices with multiple threshold voltages, in accordance with some embodiments.
Figure 14B:
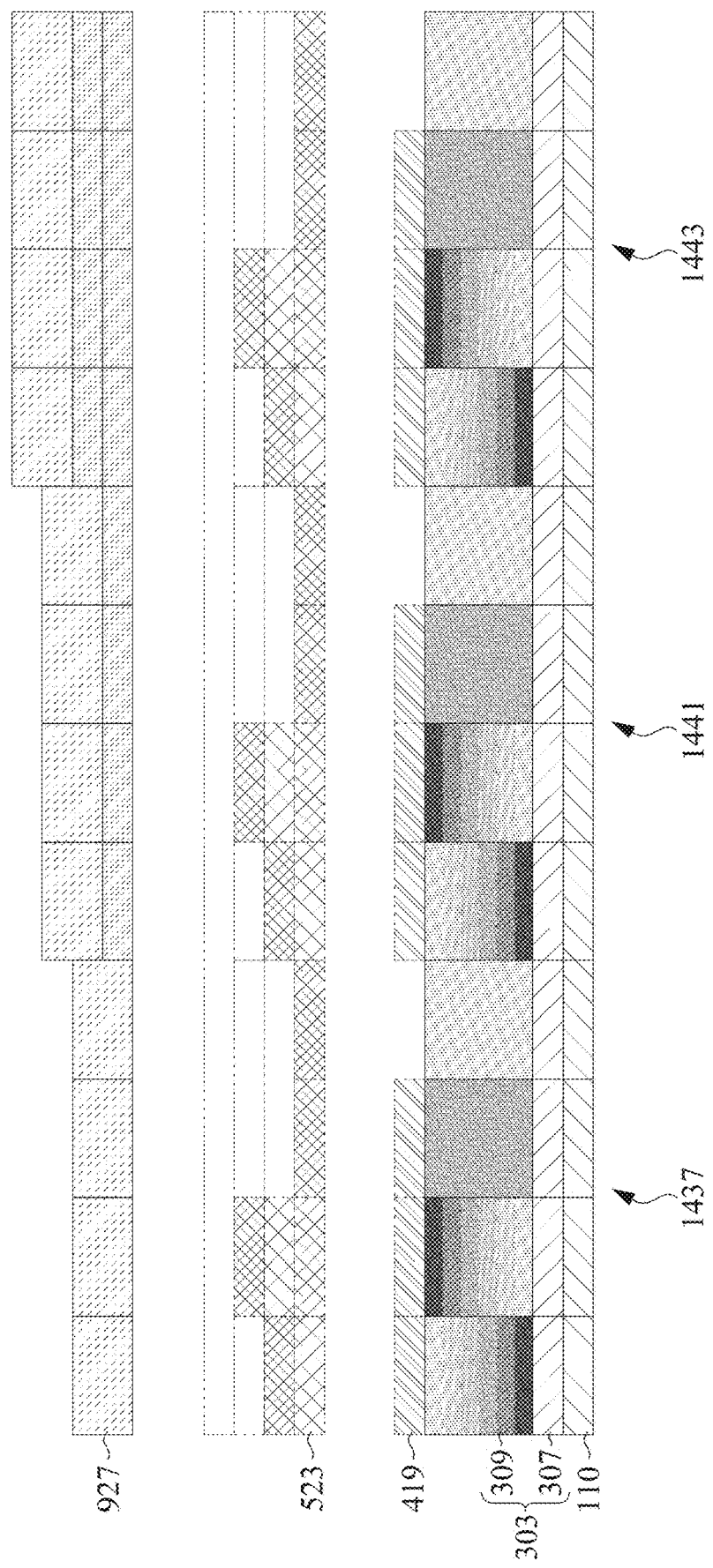

With a higher silicon and/or germanium concentration in dopant pulling layer 523 at region 175B, high-k dielectric layer 309 can have lower dopant concentration adjacent to interfacial layer 307 and smaller dopant dipoles can be formed at the interface of high-k dielectric layer 309 and interfacial layer 307, which can tune FET 105B to have a smaller $V_t$ shift (e.g., about 28 mV or less). In addition, devices can have a larger range of $V_t$ shift and more devices with different $V_t$ shift can be fabricated. FIGS. 14A-14B illustrate various embodiments of forming semiconductor devices with multiple threshold voltages (multi-Vi), in accordance with some embodiments. Multi-$V_t$ semiconductor devices can have $V_t$ tuned by dopant pulling layer 523 and buffer layer 417 as shown in FIG. 14A or by dopant pulling layer 523 as shown in FIG. 14B. As shown in FIGS. 14A and 14B, dipole devices 1437, 1441, and 1443 can be fabricated with controlled doping by dopant pulling layer 523. With the combinations of different channels (e.g., n-type Si channel and p-type SiGe channel), different Si or Ge concentrations in dopant pulling layer 523, and different layers of gate electrode 927 (e.g., n-type work function layer and p-type work function layer), semiconductor devices with twenty-four different $V_t$ shifts can be fabricated, about 33% increase from previous semiconductor devices with eighteen different $V_t$ shifts.

Various embodiments of the present disclosure provide methods for forming semiconductor device 100 having gate dielectric layer 303 with controlled doping. In some embodiments, gate dielectric layer 303 of semiconductor device 100 can be formed on fin structures 110. Gate dielectric layer 303 can include an interfacial layer 307 on fin structures 110 and a high-k dielectric layer 309 the interfacial layer 307. In some embodiments, a buffer layer 417 can be formed on gate dielectric layer 303. A dopant source layer 419 can be formed on buffer layer 417 to dope a portion of high-k dielectric layer 309 adjacent to interfacial layer 307 and form dopant dipoles at the interface of high-k dielectric layer 309 and interfacial layer 307. After removal of buffer layer 417 and dopant source layer 419, a dopant pulling layer 523 can be formed on gate dielectric layer 303. Dopant pulling layer 523 can include different concentrations of silicon or germanium to tune the dopant in gate dielectric layer 303 under a thermal condition, thereby tuning the $V_t$ of semiconductor device 100.

Buffer layer 417 can prevent mixing of dopant source layer 419 and high-k dielectric layer 309, thereby reducing compound particle defects. In addition, buffer layer 417 can have a higher etch selectivity to high-k dielectric layer 309 compared to dopant source layer 419, which can reduce non-uniform and/or excessive loss of high-k dielectric layer 309 during the etching process. A uniform dopant profile in gate dielectric layer 303 across a fin structure can be achieved with buffer layer 417 and dopant pulling layer 523. With the dopant diffused from dopant source layer 419 through buffer layer 417 and the dopant tuning of dopant pulling layer 523, a lower dopant concentration (e.g., less than about $5\times10^{13}$ atoms/cm$^2$) and a smaller dopant dipole at the interface for a smaller $V_t$ shift (e.g., about 28 mV or less) can be achieved uniformly throughout the wafer. In some embodiments, buffer layer 417 can be removed before depositing gate electrode 927. In some embodiments, buffer layer 417 may not be removed and dopant pulling layer 523 can be formed on buffer layer 417. In some embodiments, an additional high-k dielectric layer 1333 can be formed on gate dielectric layer 303 after removal of dopant source layer 419. In some embodiments, dopant pulling layer 523 can be removed and gate electrode 927 can be formed on gate dielectric layer 303. In some embodiments, dopant pulling layer 523 may not be removed and gate electrode 927 can be formed on dopant pulling layer 523. In some embodiments, the dopant concentration in doped portion 309-1 of high-k dielectric layer 309 can depend on the concentration of silicon or germanium in dopant pulling layer 523 and/or a total thickness of buffer layer 417. In some embodiments, an intermixing layer 309-3 of high-k dielectric layer 309 and dopant pulling layer 523 can be formed in a top portion of high-k dielectric layer 309. Intermixing layer 309-3 can include silicon or germanium and can prevent metal (e.g., aluminum) diffusion from work function layers of gate electrode 927 into high-k dielectric layer 309 and improve the device reliability. In some embodiments, the dopants in gate dielectric layer 303 with controlled doping may not diffuse across boundaries of adjacent FETs, thereby mitigating boundary effect.

In some embodiments, a method includes forming a gate dielectric layer on a fin structure. The gate dielectric layer includes an interfacial layer on the fin structure and a high-k dielectric layer on the interfacial layer. The method further includes forming a buffer layer on the gate dielectric layer, forming a dopant source layer including a dopant on the buffer layer, doping a portion of the high-k dielectric layer adjacent to the interfacial layer with the dopant, removing the dopant source layer and the buffer layer, forming a dopant pulling layer on the gate dielectric layer, and tuning the dopant in the gate dielectric layer by the dopant pulling layer.

In some embodiments, a method includes forming a first gate dielectric layer on a first fin structure and a second gate dielectric layer on a second fin structure. The first gate dielectric layer includes a first interfacial layer on the first fin structure and a first high-k dielectric layer on the first interfacial layer. The second gate dielectric layer includes a second interfacial layer on the second fin structure and a second high-k dielectric layer on the second interfacial layer. The methods further includes forming a first buffer layer on the first gate dielectric layer and a second buffer layer on the second gate dielectric layer, forming a dopant source layer including a dopant on the first and second buffer layers, doping a portion of the first high-k dielectric layer adjacent to the first interfacial layer and a portion of the second high-k dielectric layer adjacent to the second interfacial layer with the dopant, and removing the dopant source layer. The method further includes removing at least one of the first buffer layer and the second buffer layer, forming a first dopant pulling layer on the first gate dielectric layer and a second dopant pulling layer on the second gate dielectric layer, and tuning the dopant in the first and second gate dielectric layers by the first and second dopant pulling layers respectively. The first and second dopant pulling layers include silicon or germanium at different concentrations.

In some embodiments, a semiconductor device includes a fin structure on a substrate, an interfacial layer on the fin structure, and a high-k dielectric layer on the interfacial layer. A portion of the high-k dielectric layer adjacent to the interfacial layer includes a dopant. The semiconductor device further includes an intermixing layer on the high-k dielectric layer. The intermixing layer includes silicon or germanium.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a gate dielectric layer on a fin structure, wherein the gate dielectric layer comprises an interfacial layer on the fin structure and a high-k dielectric layer on the interfacial layer;
   forming a buffer layer on the gate dielectric layer;
   forming, on the buffer layer, a dopant source layer comprising a dopant;
   doping, with the dopant, a portion of the high-k dielectric layer adjacent to the interfacial layer;
   removing the dopant source layer and the buffer layer;
   forming a dopant pulling layer on the gate dielectric layer; and
   decreasing the dopant in the gate dielectric layer with the dopant pulling layer.

2. The method of claim 1, further comprising forming an additional high-k dielectric layer on the high-k dielectric layer prior to forming the dopant pulling layer.

3. The method of claim 1, further comprising:
   removing the dopant pulling layer; and
   forming a gate electrode on the gate dielectric layer.

4. The method of claim 1, further comprising forming a gate electrode on the dopant pulling layer.

5. The method of claim 1, wherein the doping the portion of the high-k dielectric layer comprises diffusing, under a thermal condition, the dopant to the portion of the high-k dielectric layer.

6. The method of claim 1, further comprising forming an intermixing layer between the high-k dielectric layer and the dopant pulling layer, wherein the intermixing layer comprises silicon or germanium.

7. The method of claim 1, wherein the dopant pulling layer comprises one or more of titanium nitride, titanium silicon nitride, silicon nitride, titanium germanium nitride, germanium nitride, titanium germanium nitride, tantalum silicon nitride, tantalum germanium nitride, tantalum silicon germanium nitride, tantalum nitride, tungsten silicon nitride, tungsten germanium nitride, tungsten silicon germanium nitride, tungsten nitride, tungsten carbon nitride, silicon, germanium, silicon germanium, titanium silicide, tantalum silicide, tungsten silicide, and boron tungsten silicide, and wherein the tuning the dopant in the gate dielectric layer comprises tuning the dopant under a thermal condition.

8. A method, comprising:
forming a first gate dielectric layer on a first fin structure and a second gate dielectric layer on a second fin structure, wherein the first gate dielectric layer comprises a first interfacial layer on the first fin structure and a first high-k dielectric layer on the first interfacial layer, and wherein the second gate dielectric layer comprises a second interfacial layer on the second fin structure and a second high-k dielectric layer on the second interfacial layer;
forming a first buffer layer on the first gate dielectric layer and a second buffer layer on the second gate dielectric layer;
forming, on the first and second buffer layers, a dopant source layer comprising a dopant;
doping, with the dopant, a portion of the first high-k dielectric layer adjacent to the first interfacial layer and a portion of the second high-k dielectric layer adjacent to the second interfacial layer;
removing the dopant source layer;
removing at least one of the first buffer layer and the second buffer layer;
forming a first dopant pulling layer on the first gate dielectric layer and a second dopant pulling layer on the second gate dielectric layer, wherein the first and second dopant pulling layers comprise silicon or germanium at different concentrations; and
tuning the dopant in the first and second gate dielectric layers by the first and second dopant pulling layers, respectively.

9. The method of claim 8, further comprising forming an additional high-k dielectric layer on the first and second high-k dielectric layers prior to forming the first and second dopant pulling layers.

10. The method of claim 8, further comprising:
removing the first and second dopant pulling layers; and
forming first and second gate electrodes on the first and second gate dielectric layers, respectively.

11. The method of claim 8, further comprising forming first and second gate electrodes on the first and second dopant pulling layers, respectively.

12. The method of claim 8, further comprising:
forming a first intermixing layer between the first high-k dielectric layer and the first dopant pulling layer, wherein the first intermixing layer comprises silicon or germanium; and
forming a second intermixing layer between the second high-k dielectric layer and the second dopant pulling layer, wherein the second intermixing layer comprises silicon or germanium.

13. The method of claim 8, wherein the doping the portion of the first high-k dielectric layer and the portion of the second high-k dielectric layer comprises diffusing, under a thermal condition, the dopant to the portion of the first high-k dielectric layer and the portion of the second high-k dielectric layer.

14. The method of claim 8, wherein the forming the first and second buffer layers comprises forming the first and second buffer layers having substantially the same thickness, same compositions, and substantially the same percentage of crystallinity.

15. The method of claim 8, wherein the forming the first and second buffer layers comprises forming the first and second buffer layers having different thicknesses, different compositions, or different percentages of crystallinity.

16. The method of claim 8, wherein the removing the at least one of the first buffer layer and the second buffer layer comprises removing only the first buffer layer.

17. The method of claim 8, wherein the removing the at least one of the first buffer layer and the second buffer layer comprises removing the first buffer layer and the second buffer layer.

18. A method, comprising:
forming an interfacial layer on first and second fin structures;
forming a high-k dielectric layer on the interfacial layer over the first and second fin structures;
forming a buffer layer on the high-k dielectric layer;
doping the buffer layer and the high-k dielectric layer with a dopant;
forming a first dopant pulling layer on the high-k dielectric layer over the first fin structure and a second dopant pulling layer on the high-k dielectric layer over the second fin structure, wherein the first and second dopant pulling layers comprise silicon at different concentrations; and
tuning the dopant in the high-k dielectric layer over the first and second fin structures by the first and second dopant pulling layers, respectively.

19. The method of claim 18, further comprising:
removing the buffer layer from the high-k dielectric layer;
forming an additional high-k dielectric layer on the doped high-k dielectric layer prior to forming the first and second dopant pulling layers.

20. The method of claim 18, further comprising:
removing the first and second dopant pulling layers; and
forming first and second gate electrodes on the buffer layer over the first and second fin structures, respectively.

* * * * *